(12) United States Patent
Harada et al.

(10) Patent No.: US 10,267,469 B2
(45) Date of Patent: Apr. 23, 2019

(54) SEMICONDUCTOR LIGHT-EMITTING DEVICE, LIGHTING APPARATUS, AND LIGHTING UNIT FOR VEHICLES

(71) Applicant: STANLEY ELECTRIC CO., LTD., Meguro-ku, Tokyo (JP)

(72) Inventors: Mitsunori Harada, Tokyo (JP); Yuji Takehara, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/411,666

(22) Filed: Jan. 20, 2017

(65) Prior Publication Data
US 2017/0210277 A1 Jul. 27, 2017

(30) Foreign Application Priority Data
Jan. 22, 2016 (JP) .................................. 2016-010686

(51) Int. Cl.
| | |
|---|---|
| *F21S 41/141* | (2018.01) |
| *H01L 33/20* | (2010.01) |
| *H01L 25/075* | (2006.01) |
| *F21S 41/143* | (2018.01) |
| *F21S 45/48* | (2018.01) |
| *H01L 33/50* | (2010.01) |
| *H01L 33/62* | (2010.01) |
| *B60Q 1/08* | (2006.01) |
| *F21S 41/255* | (2018.01) |
| *F21S 45/47* | (2018.01) |

(52) U.S. Cl.
CPC .......... *F21S 41/141* (2018.01); *F21S 41/143* (2018.01); *F21S 45/48* (2018.01); *H01L 25/0753* (2013.01); *H01L 33/20* (2013.01); *B60Q 1/085* (2013.01); *B60Q 2300/112* (2013.01); *B60Q 2300/122* (2013.01); *B60Q 2300/42* (2013.01); *B60Q 2300/45* (2013.01); *F21S 41/255* (2018.01); *F21S 45/47* (2018.01); *H01L 33/50* (2013.01); *H01L 33/62* (2013.01)

(58) Field of Classification Search
CPC ....... H01L 33/382; B60Q 1/085; F21S 41/143
See application file for complete search history.

(56) References Cited

U.S. PATENT DOCUMENTS 8,686,636 B2 * 4/2014 Saito ........................ F21S 41/19
313/538
9,494,288 B2 11/2016 Kobayashi
(Continued)

FOREIGN PATENT DOCUMENTS

JP 5605626 B2 10/2014
JP 5823211 B2 11/2015

*Primary Examiner* — Jamie C Niesz
(74) *Attorney, Agent, or Firm* — Holtz, Holtz & Volek PC

(57) ABSTRACT

A semiconductor light-emitting device having a longitudinal direction, and able to smoothly incline luminance for the longitudinal direction is provided. The semiconductor light-emitting device comprises a substrate and a plurality of semiconductor light-emitting layers of a predetermined shape disposed in a row on the substrate. The semiconductor light-emitting layers have such a structure that light emission amount of light-emitting surface of each semiconductor light-emitting layer inclines from a side of one predetermined end toward a side of the other end for the direction of the row.

8 Claims, 18 Drawing Sheets

(56) References Cited

U.S. PATENT DOCUMENTS

2012/0051079 A1\* 3/2012 Saito .................... F21S 41/147
362/538
2012/0236584 A1\* 9/2012 Ueno ..................... H01L 33/38
362/538

\* cited by examiner

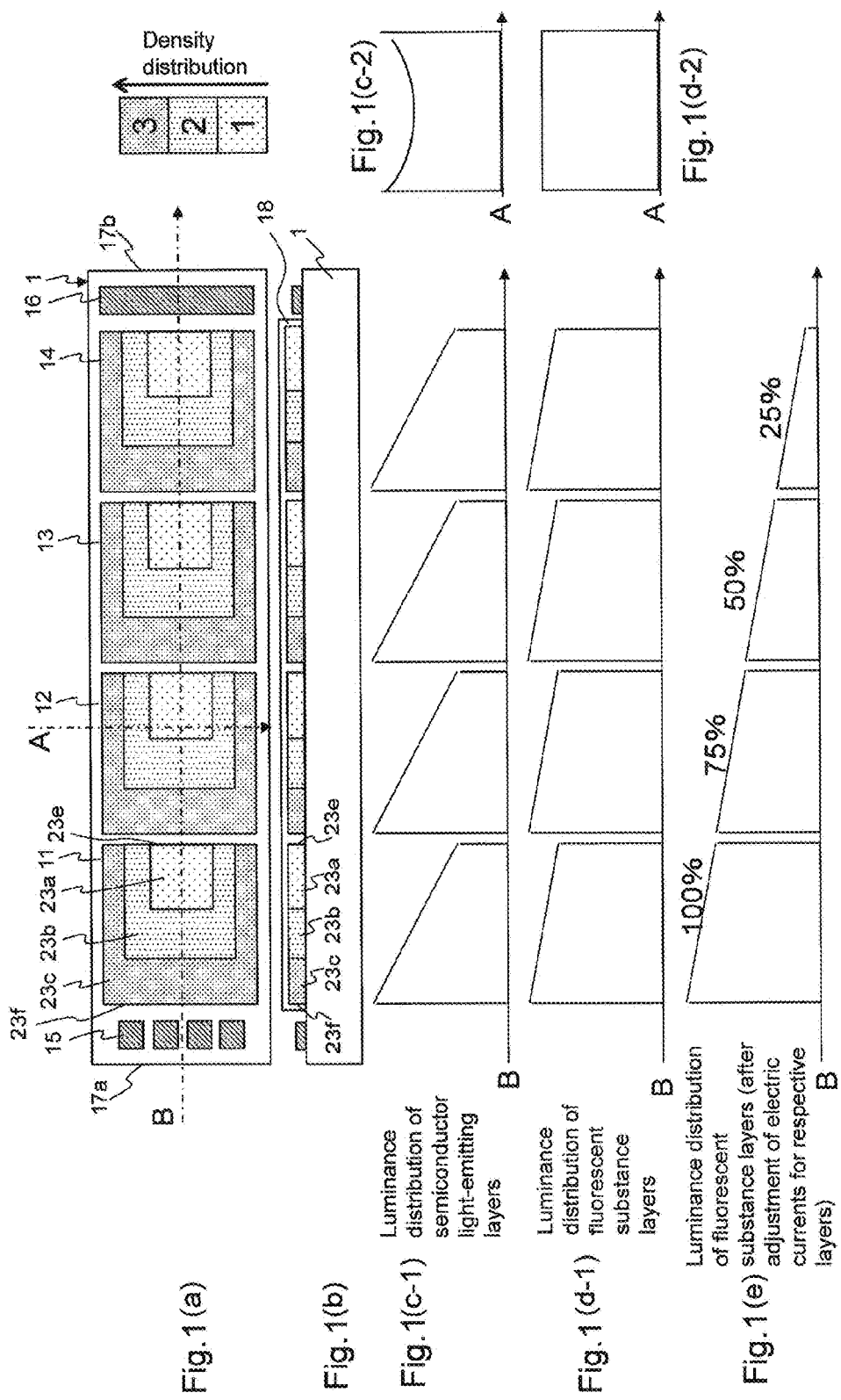

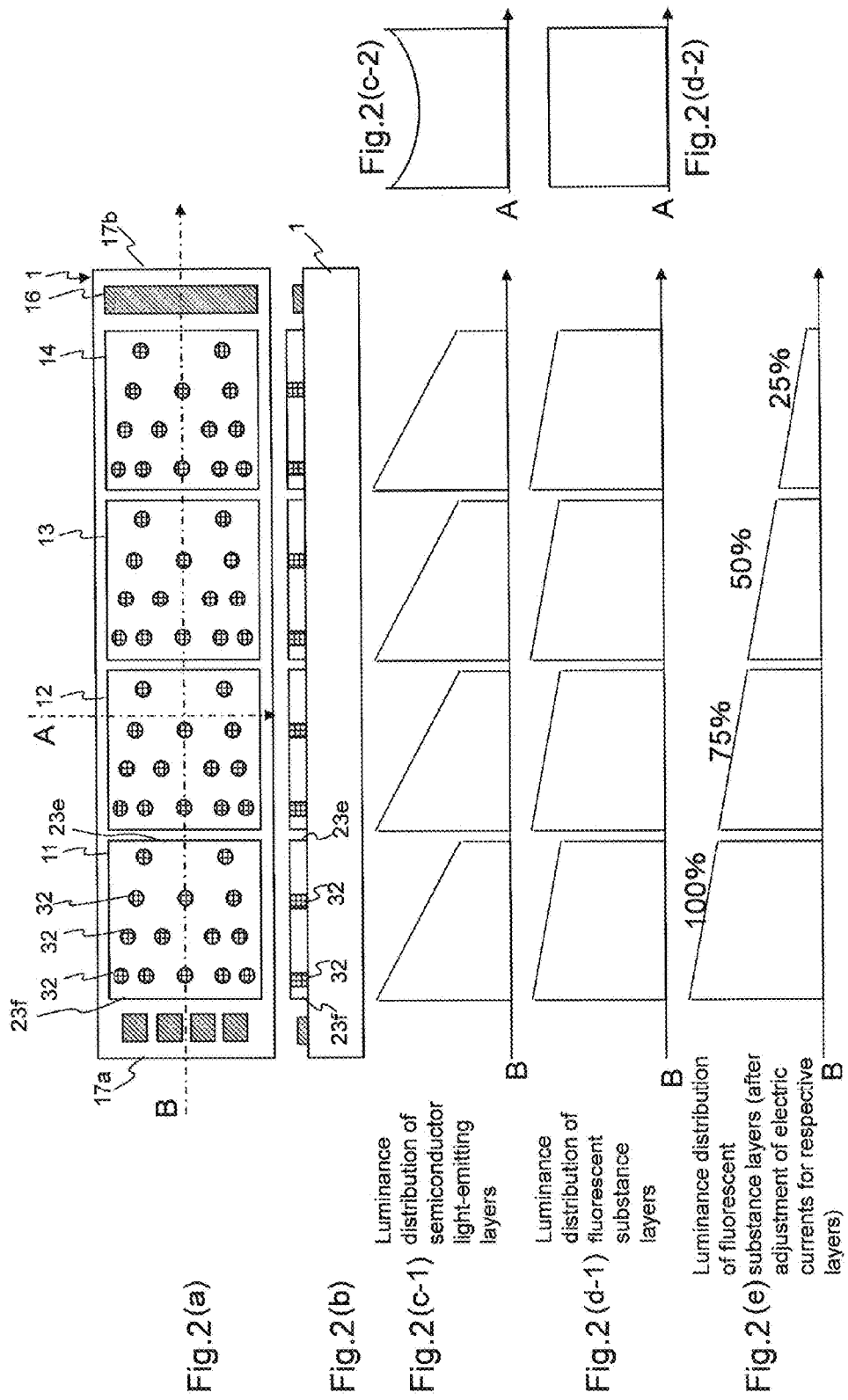

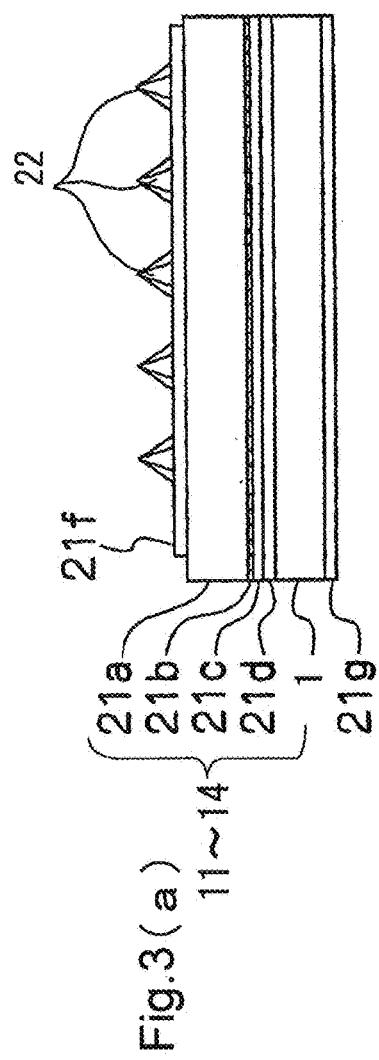
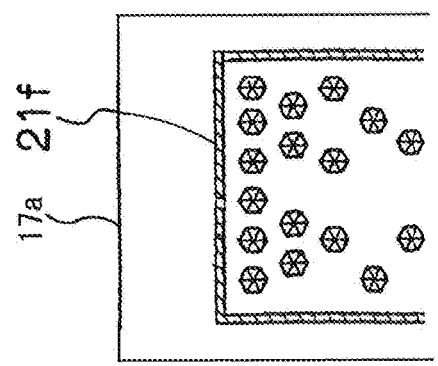
Fig.3(a)
Fig.3(b)

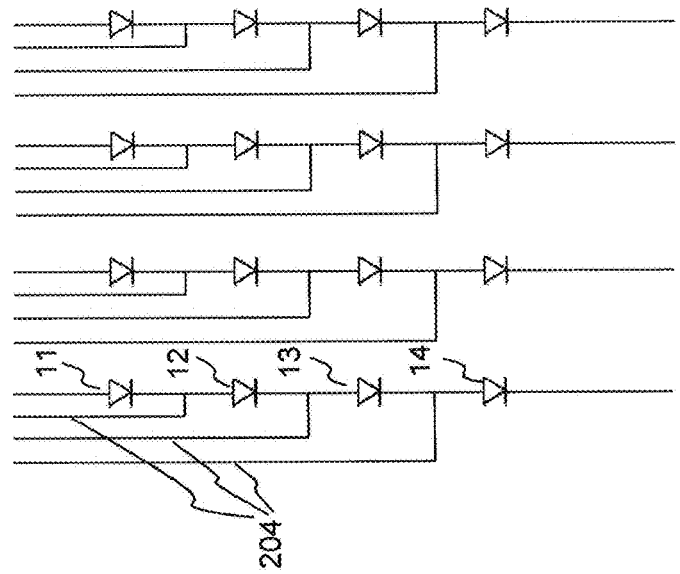
Fig.5 (b) Switching circuit
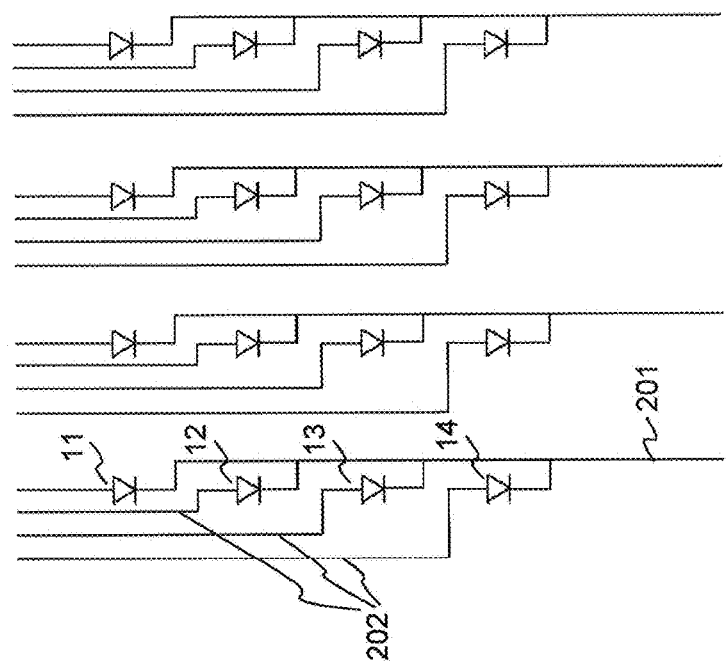
Fig.5 (a) Cathode common

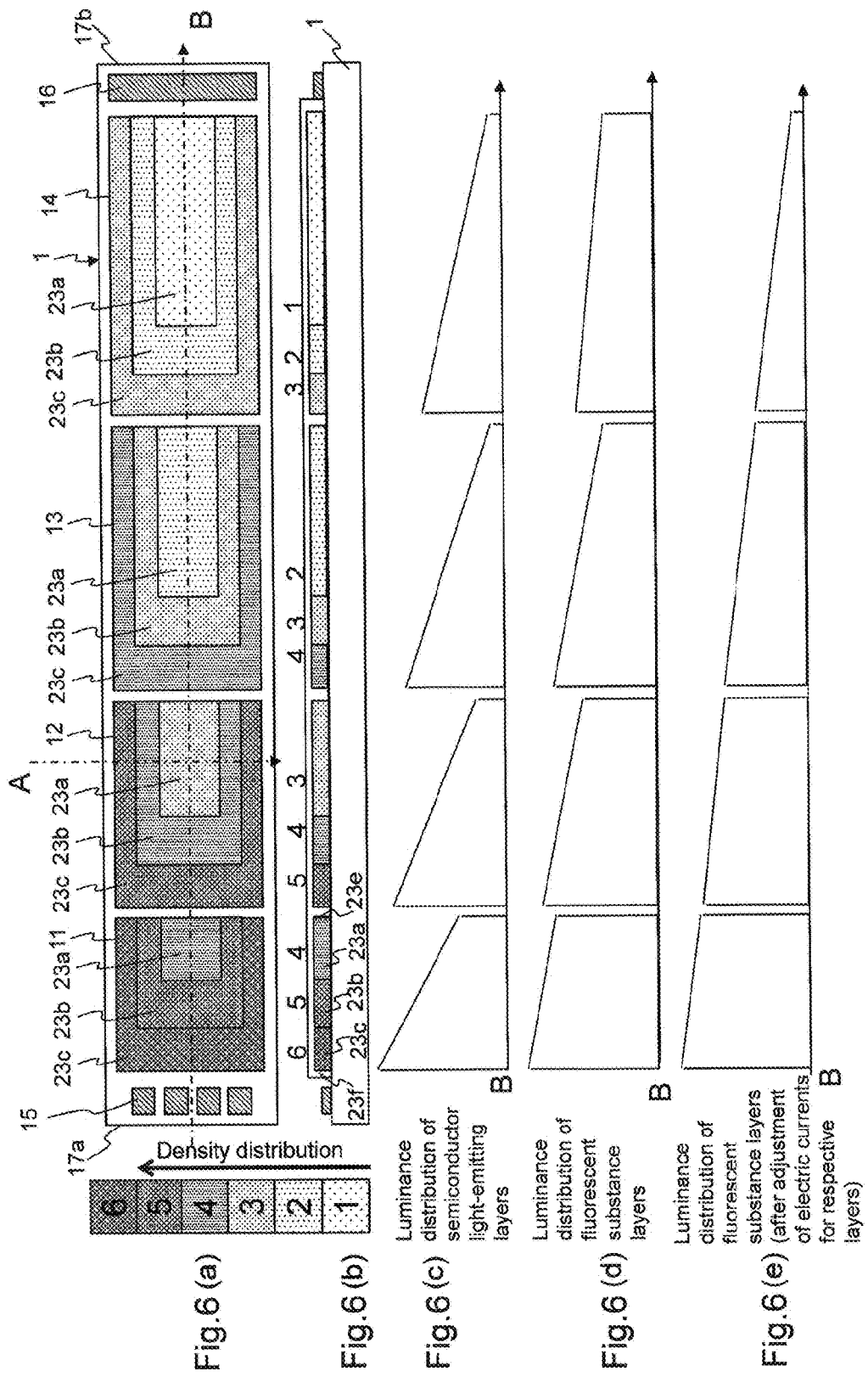

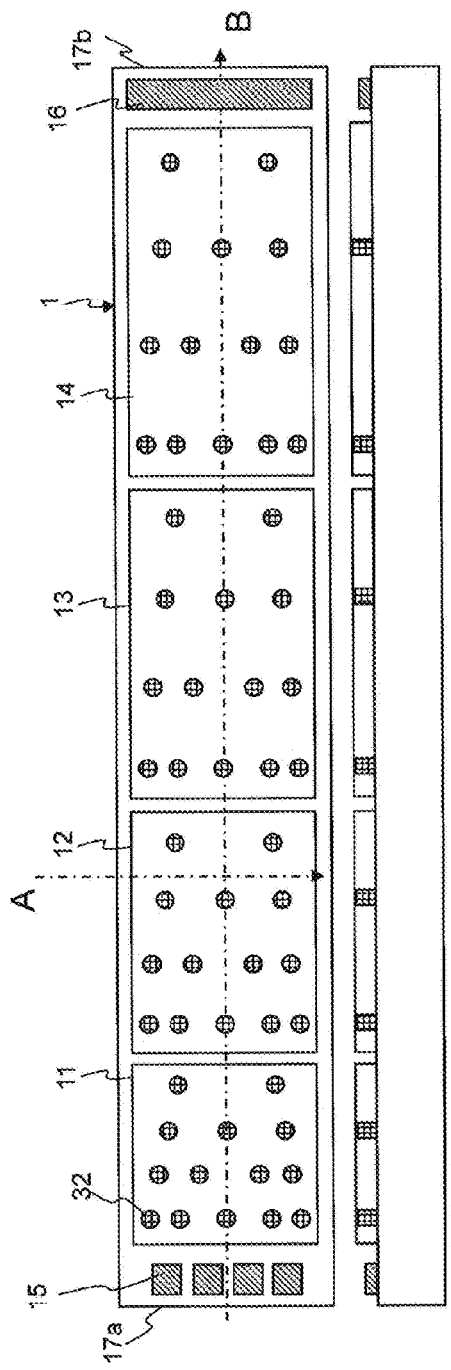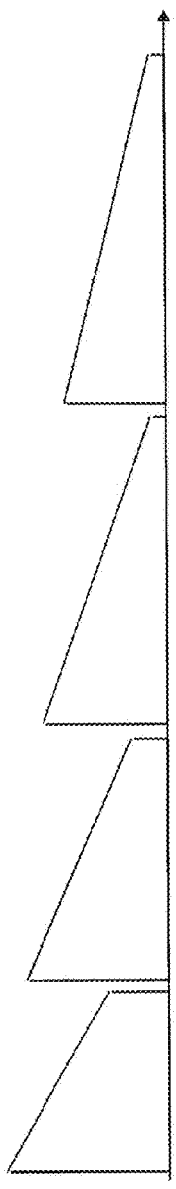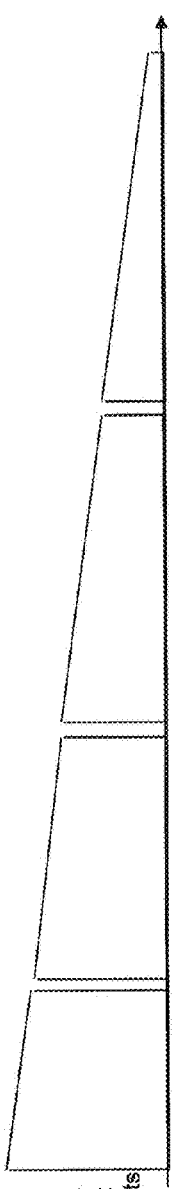
Fig.7(a)
Fig.7(b)
Fig.7(c) Luminance distribution of semiconductor light-emitting layers
Fig.7(d) Luminance distribution of fluorescent substance layers
Fig.7(e) Luminance distribution of fluorescent substance layers (after adjustment of electric currents for respective B layers)

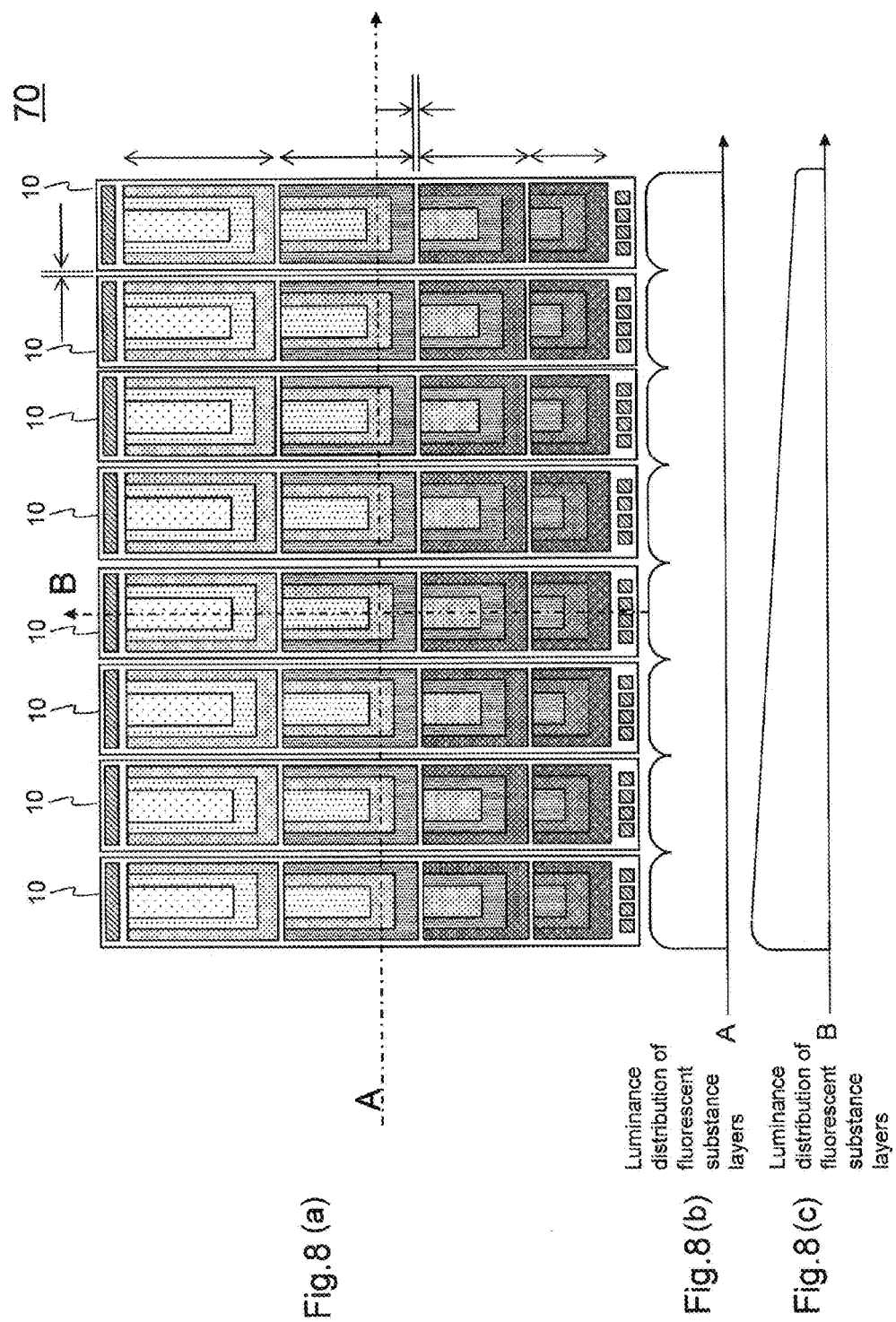

Fig.10(b) Luminance distribution of fluorescent substance layers

Fig.10(c) Luminance distribution of fluorescent substance layers

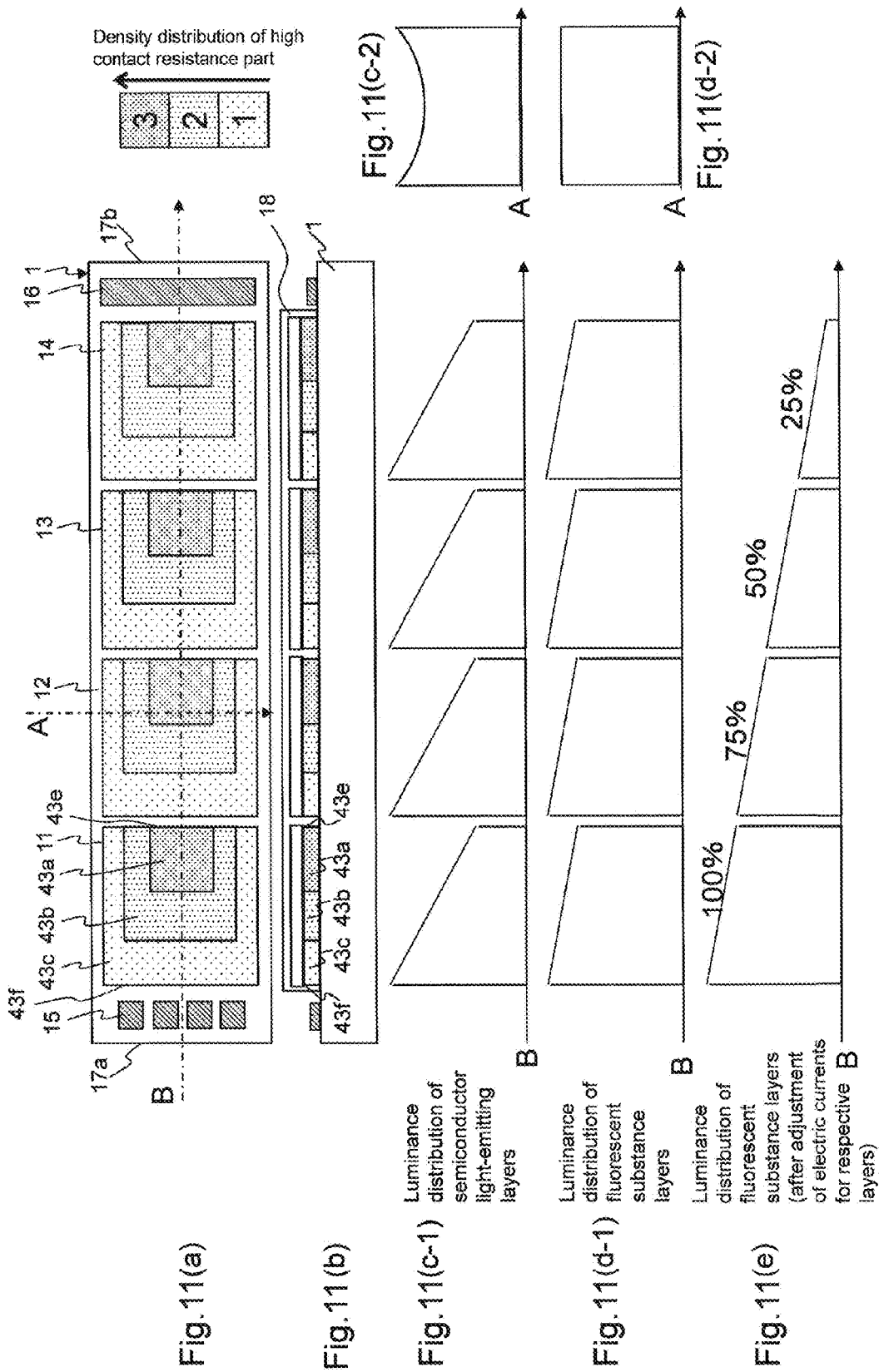

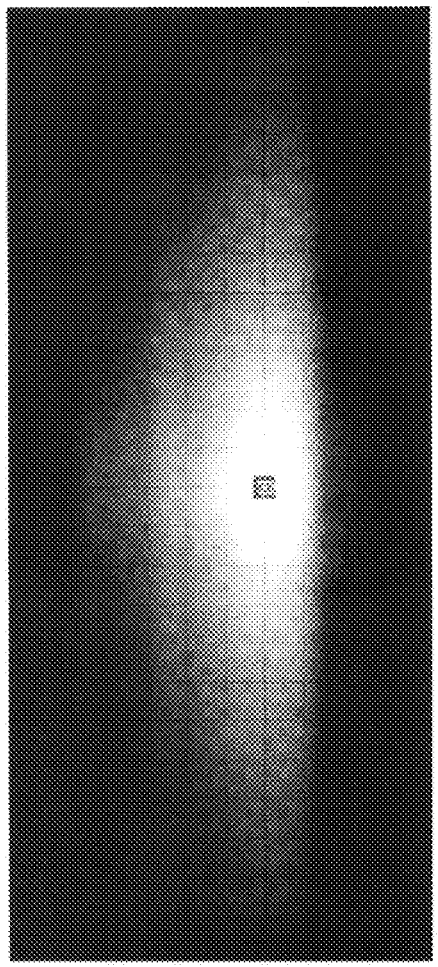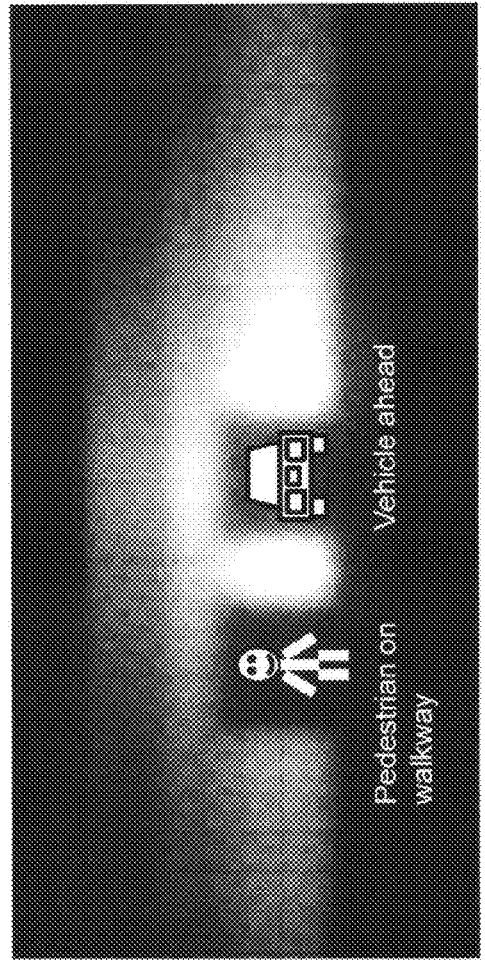
Fig.15 (a) Usual running mode (high beam)
Fig.15 (b) Oncoming vehicle-detected mode

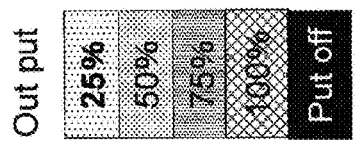
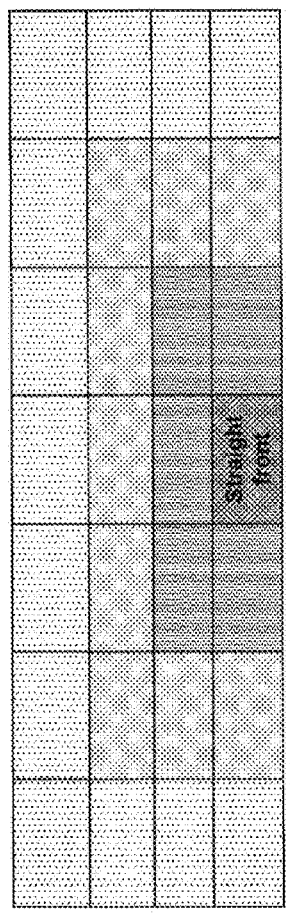
Fig. 16 (a)
Usual running mode (high beam)
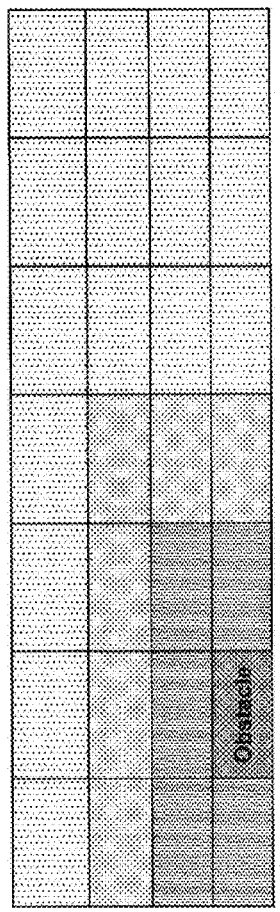
Fig. 16 (b)
Obstacle-detected mode
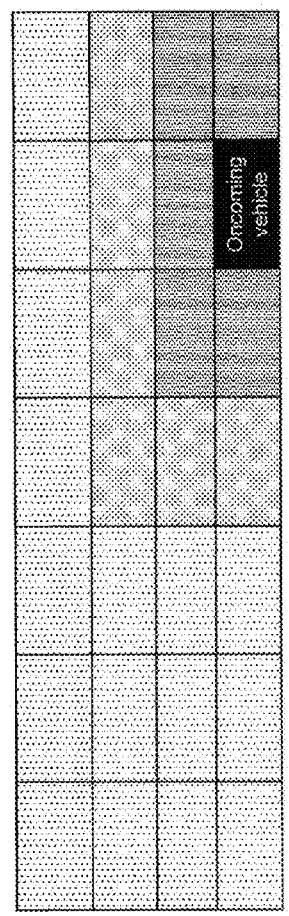
Fig. 16 (c)
Oncoming vehicle-detected mode

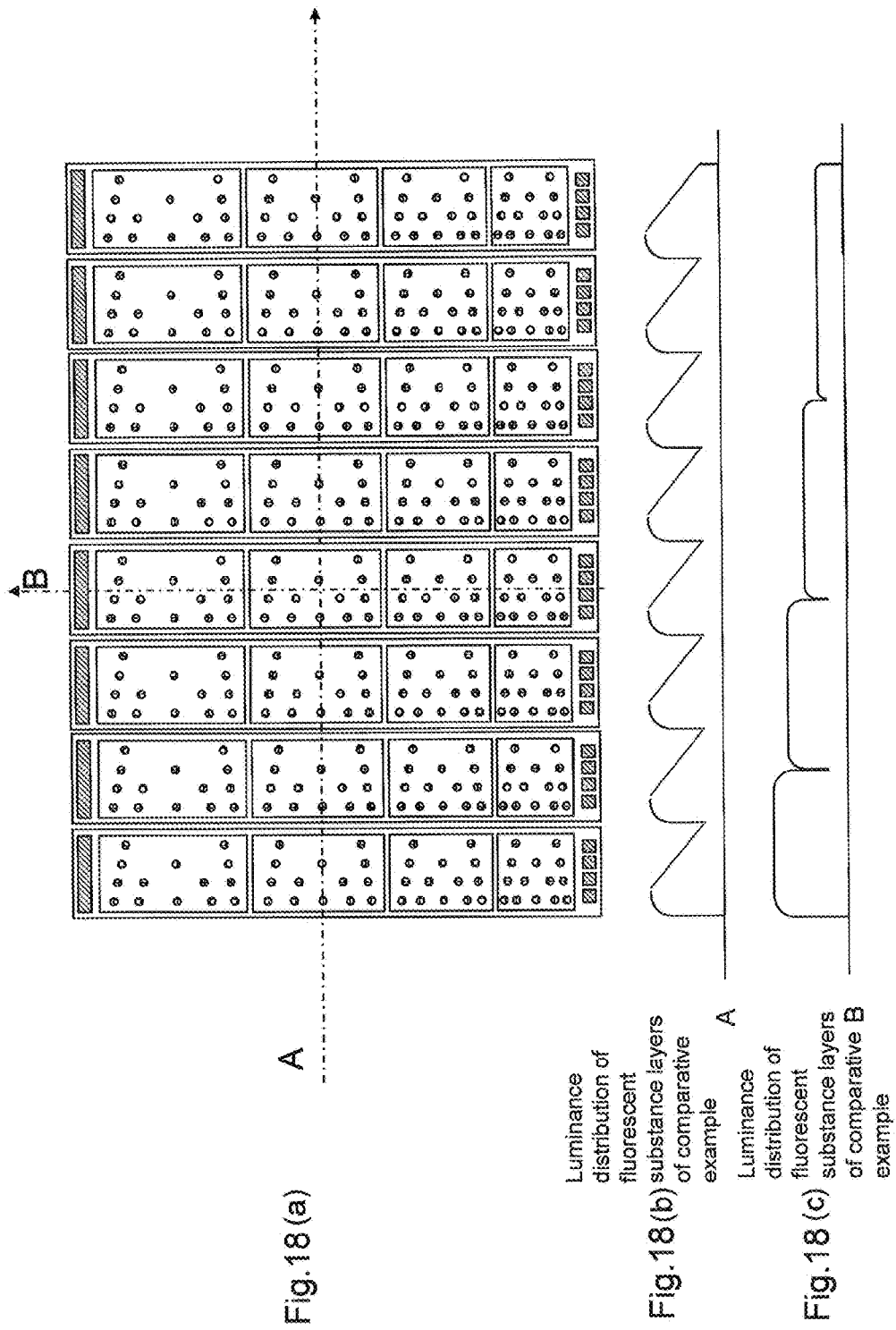

SEMICONDUCTOR LIGHT-EMITTING DEVICE, LIGHTING APPARATUS, AND LIGHTING UNIT FOR VEHICLES

TECHNICAL FIELD

The present invention relates to a semiconductor light-emitting device, in particular, a semiconductor light-emitting device suitable as a light source of a lighting equipment for vehicles.

BACKGROUND ART

Patent document 1 discloses a configuration of lighting equipment for vehicles using a semiconductor light-emitting element in which the semiconductor light-emitting element is disposed so that the position of the maximum luminance part of the luminance distribution thereof should be on the cutoff line without cutting any part of light emitted from the semiconductor light-emitting element. In this configuration, a plurality of minute convexes (or concaves) for enhancing light extraction efficiency are provided on an upper surface (light-emitting surface) of a rectangular semiconductor layer of which longitudinal direction is parallel to the cutoff line. The minute convexes are more densely provided in a region closer to one long side of the rectangular semiconductor layer along the cutoff line among the two long sides of the rectangular semiconductor layer, and more sparsely provided in a region remoter from that long side. That is, density of the minute convexes changes along the direction of the short side of the rectangular semiconductor layer. As a result, light emission amount of the light-emitting surface of the semiconductor light-emitting element becomes larger in a region closer to the end corresponding to the cutoff line, and therefore the semiconductor light-emitting element can be disposed so that the maximum luminance part of the luminance distribution thereof should be on the end corresponding to the cutoff line.

Patent document 2 discloses a lighting equipment for vehicles in which a plurality of semiconductor light-emitting elements are disposed in the shape of a two-dimensional matrix, and lights emitted by the semiconductor light-emitting elements are projected with a lens along directions for which the lights should be irradiated. With such a lighting equipment for vehicles, light projection can be controlled so that the lights are not projected to an oncoming vehicle or the like by detecting position of the oncoming vehicle or the like, and turning off the semiconductor light-emitting elements that project lights to the oncoming vehicle or the like. The light projection can also be controlled so that, after a position of obstacle on a driveway is detected, projection light amount for the direction of the obstacle is increased.

PRIOR ART REFERENCES

Patent Documents

Patent document 1: Japanese Patent No. 5605626 (FIG. 14)
Patent document 2: Japanese Patent No. 5823211 (FIG. 7)

SUMMARY OF THE INVENTION

Object to be Achieved by the Invention

In the semiconductor light-emitting element of the lighting equipment for vehicles of Patent document 1, the luminance distribution is inclined by changing the density of the convexes for the direction of the short side of the rectangular semiconductor layer. However, it does not control the luminance for the longitudinal direction. Therefore, if a fluorescent substance layer for wavelength conversion is provided on the upper surface of the semiconductor light-emitting element, luminance becomes highest at the center part, and becomes lower at a position closer to the end for the longitudinal direction, because of influence of scattering of light caused by the fluorescent substance layer.

If it is attempted to dispose the semiconductor light-emitting elements of Patent document 1 in the shape of a two-dimensional matrix to constitute the lighting equipment for vehicles disclosed in Patent document 2, a luminance distribution in which the luminance is highest at the center part, and becomes lower at a position closer to one of the both ends is repeated for the long side direction of the semiconductor light-emitting elements. Therefore, it is difficult to obtain a luminance distribution in which luminance smoothly reduces for the longitudinal direction.

Further, when a desired light distribution is attained in the lighting equipment for vehicles of Patent document 2 in which the semiconductor light-emitting elements are disposed in the shape of a two-dimensional matrix by turning on or off the individual semiconductor light-emitting elements, or controlling light amounts of them, the light amount changes stepwise in the two-dimensional projection plane. Therefore, it is desired to obtain natural light distribution by making the light-emitting elements emit lights with a smoothly inclined light amount distribution, in order to obtain a natural light amount distribution.

An object of the present invention is to provide a semiconductor light-emitting device having a longitudinal direction, and able to show smoothly inclining luminance distribution along the longitudinal direction.

Means for Achieving the Object

In order to achieve the aforementioned object, the semiconductor light-emitting device of the present invention comprises a substrate and a plurality of semiconductor light-emitting layers having a predetermined shape and disposed in a row on the substrate. The semiconductor light-emitting layers constitute such a structure that distribution of light emission amounts of them at the light-emitting surfaces thereof are inclined from the side closer to one predetermined end to the side of the other end along the direction of the row.

Effect of the Invention

According to the present invention, in a semiconductor light-emitting device having a longitudinal direction, luminance thereof can be smoothly inclined along the longitudinal direction, and therefore a smooth light distribution can be realized.

BRIEF DESCRIPTION OF THE DRAWINGS

FIG. 1(*a*) is an explanatory drawing showing the configuration of the upper surface, and the density distribution of the convexes of the semiconductor light-emitting device of the embodiment 1, FIG. 1(*b*) is an explanatory drawing showing the configuration of the cross section, and the density distribution of the convexes of the semiconductor light-emitting device shown in FIG. 1(*a*), FIG. 1(*c*-1) shows the luminance distribution of the semiconductor light-emitting layers of the semiconductor light-emitting device shown in FIG. 1(a) for the direction B, FIG. 1(c-2) shows the luminance distribution of the semiconductor light-emitting layers of the semiconductor light-emitting device shown in FIG. 1(a) for the direction A, FIG. 1(d-1) shows the luminance distribution of emitted lights of the fluorescent substance layers of the semiconductor light-emitting device shown in FIG. 1(a) for the direction B, FIG. 1(d-2) shows the luminance distribution of emitted lights of the fluorescent substance layers of the semiconductor light-emitting device shown in FIG. 1(a) for the direction A, and FIG. 1(e) shows the luminance distribution of emitted lights of the fluorescent substance layers of the semiconductor light-emitting device for the direction B.

FIG. 2(a) is an explanatory drawing showing the configuration of the upper surface, and the density distribution of the via electrodes of the semiconductor light-emitting device of the embodiment 2, FIG. 2(b) is an explanatory drawing showing the configuration of the cross section, and the density distribution of the via electrodes of the semiconductor light-emitting device shown in FIG. 2(a), FIG. 2(c-1) shows the luminance distribution of the semiconductor light-emitting layers of the semiconductor light-emitting device shown in FIG. 2(a) for the direction B, FIG. 2(c-2) shows the luminance distribution of the semiconductor light-emitting layers of the semiconductor light-emitting device shown in FIG. 2(a) for the direction A, FIG. 2(d-1) shows the luminance distribution of emitted lights of the fluorescent substance layers of the semiconductor light-emitting device shown in FIG. 2(a) for the direction B, FIG. 2(d-2) shows the luminance distribution of emitted lights of the fluorescent substance layers of the semiconductor light-emitting device shown in FIG. 2(a) for the direction A, and FIG. 2(e) shows the luminance distribution of emitted lights of the fluorescent substance layers of the semiconductor light-emitting device for the direction B.

FIG. 3(a) is a cross-sectional view of an example of the semiconductor light-emitting layer of the semiconductor light-emitting device of the embodiment 1, and FIG. 3(b) is a top view of the semiconductor light-emitting layer shown in FIG. 3(a).

FIGS. 5(a) and 5(b) are circuit diagrams showing examples of the wiring pattern of the semiconductor light-emitting device of the embodiment 1.

FIG. 6(a) is an explanatory drawing showing the configuration of the upper surface, and the density distribution of the convexes of the semiconductor light-emitting device of the embodiment 3, FIG. 6(b) is an explanatory drawing showing the configuration of the cross section, and the density distribution of the convexes of the semiconductor light-emitting device shown in FIG. 6(a), FIG. 6(c) shows the luminance distribution of the semiconductor light-emitting layers of the semiconductor light-emitting device shown in FIG. 6(a) for the direction B, FIG. 6(d) shows the luminance distribution of emitted lights of the fluorescent substance layers of the semiconductor light-emitting device shown in FIG. 6(a) for the direction B, and FIG. 6(e) shows the luminance distribution of emitted lights of the fluorescent substance layers of the semiconductor light-emitting device for the direction B.

FIG. 7(a) is an explanatory drawing showing the configuration of the upper surface, and the density distribution of the via electrodes of the semiconductor light-emitting device of the embodiment 4, FIG. 7(b) is an explanatory drawing showing the configuration of the cross section, and the density distribution of the via electrodes of the semiconductor light-emitting device shown in FIG. 7(a), FIG. 7(c) shows the luminance distribution of the semiconductor light-emitting layers of the semiconductor light-emitting device shown in FIG. 7(a) for the direction B, FIG. 7(d) shows the luminance distribution of emitted lights of the fluorescent substance layers of the semiconductor light-emitting device shown in FIG. 7(a) for the direction B, and FIG. 7(e) shows the luminance distribution of emitted lights of the fluorescent substance layers of the semiconductor light-emitting device for the direction B.

FIG. 8(a) is an explanatory drawing showing the configuration of the upper surface, and the density distribution of the convexes of the sheet light source of the embodiment 5, FIG. 8(b) shows the luminance distribution of the sheet light source shown in FIG. 8(a) for the direction A, and FIG. 8(c) shows the luminance distribution of the sheet light source shown in FIG. 8(a) for the direction B.

FIG. 10(b) shows the luminance distribution of the sheet light source shown in FIG. 10(a) for the direction A, and FIG. 10(c) shows the luminance distribution of the sheet light source shown in FIG. 10(a) for the direction B.

FIG. 11(a) is an explanatory drawing showing the configuration of the upper surface, and the density distribution of the non-contact electrodes of the semiconductor light-emitting device of the embodiment 7, FIG. 11(b) is an explanatory drawing showing the configuration of the cross section, and the density distribution of the non-contact electrodes of the semiconductor light-emitting device shown in FIG. 11(a), FIG. 11(c-1) shows the luminance distribution of the semiconductor light-emitting layers of the semiconductor light-emitting device shown in FIG. 11(a) for the direction B, FIG. 11(c-2) shows the luminance distribution of the semiconductor light-emitting layers of the semiconductor light-emitting device shown in FIG. 11(a) for the direction A, FIG. 11(d-1) shows the luminance distribution of emitted lights of the fluorescent substance layers of the semiconductor light-emitting device shown in FIG. 11(a) for the direction B, FIG. 11(d-2) shows the luminance distribution of the emitted lights of the fluorescent substance layers of the semiconductor light-emitting device shown in FIG. 11(a) for the direction A, and FIG. 11(e) shows the luminance distribution of emitted lights of the fluorescent substance layers of the semiconductor light-emitting device for the direction B.

FIGS. 15(a) and 15(b) include explanatory drawings showing the illuminance distribution of the light projection range of the embodiment 9. FIG. 15(a) shows the illuminance distribution in case that there is no vehicle, pedestrian or obstacle, and FIG. 15(b) shows the illuminance distribution in case that there is a vehicle or pedestrian.

FIGS. 16(a)-16(c) include explanatory drawings showing the luminance distribution of the sheet light source of the embodiment 9. FIG. 16(a) shows the luminance distribution in case that there is no vehicle, pedestrian or obstacle, FIG. 16(b) shows the luminance distribution in case that there is an obstacle, and FIG. 16(c) shows the luminance distribution in case that there is an oncoming vehicle.

FIG. 18(a) is an explanatory drawing showing the configuration of the upper surface, and the density distribution of the via electrodes of the sheet light source of the comparative example, FIG. 18(b) shows the luminance distribution of the sheet light source shown in FIG. 18(a) for the direction A, and FIG. 18(c) shows the luminance distribution of the sheet light source shown in FIG. 18(a) for the direction B.

MODES FOR CARRYING OUT THE INVENTION

Figure 4:
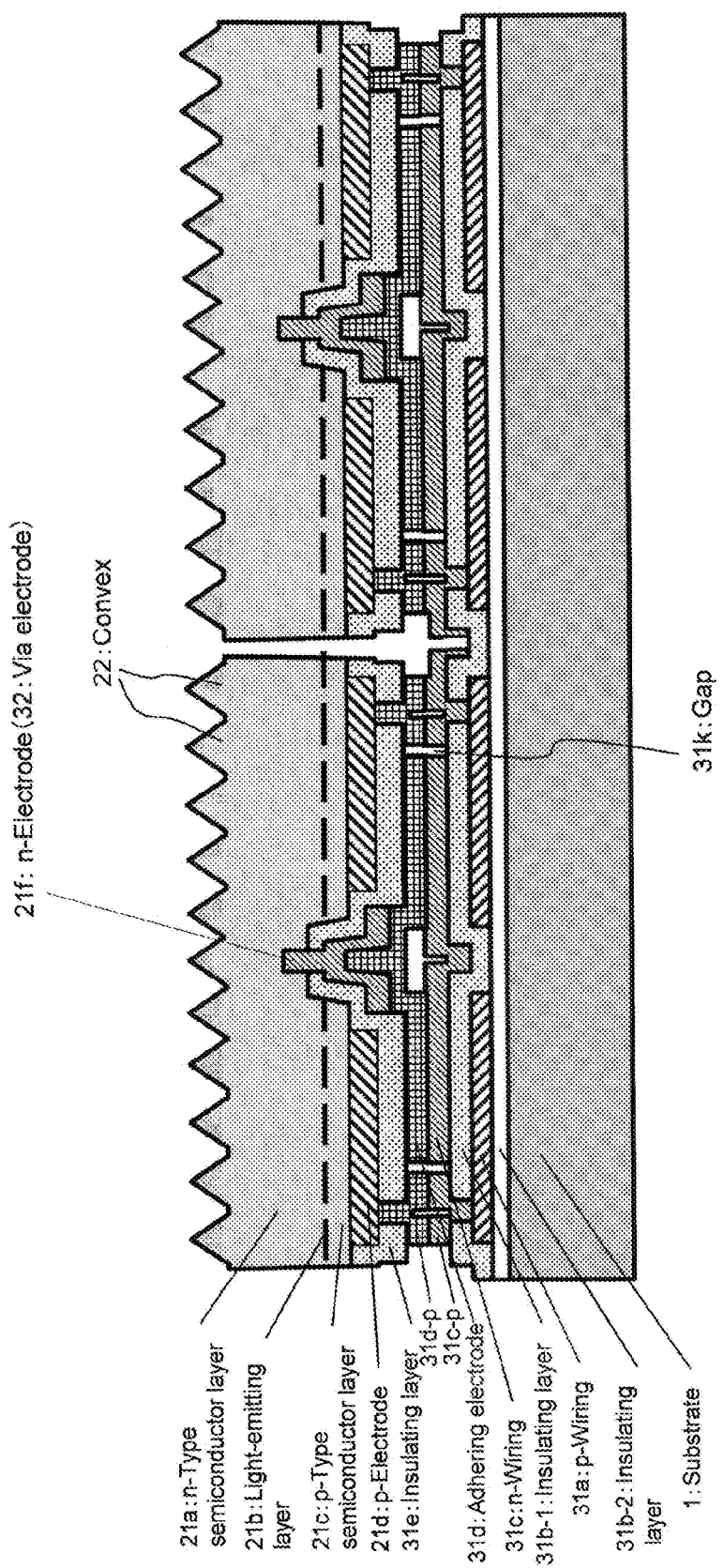
FIG. 4 is a cross-sectional view of an example of the semiconductor light-emitting layer of the semiconductor light-emitting device of the embodiment 1.

Hereafter, embodiments of the present invention will be explained.

As shown in FIG. 1(a)-1(e) and FIG. 2(a)-2(e), the semiconductor light-emitting device of embodiments of the present invention comprises a substrate 1 and a plurality of semiconductor light-emitting layers 11 to 14 having a predetermined shape and disposed in a row on the substrate 1. The semiconductor light-emitting layers 11 to 14 have such a structure that light emission amounts of light-emitting surfaces thereof are inclined from the side of one predetermined end 17a of the direction B of the row toward the side of the other end 17b as shown in FIGS. 1(c-1) and 2(c-1).

As described above, the semiconductor light-emitting device of the present invention uses the structure that the semiconductor light-emitting layer is divided into a plurality of semiconductor light-emitting layers 11 to 14 of a predetermined shape disposed in a row, and distribution of light emission amounts of the semiconductor light-emitting layers are inclined from the one end 17a to the other end 17b of the row. Therefore, for example, by controlling electric currents supplied to the semiconductor light-emitting layers 11 to 14, the luminance distribution can be smoothly inclined along the longitudinal direction B, as shown in FIGS. 1(e) and 2(e). By controlling electric currents supplied to the semiconductor light-emitting layers 11 to 14, such luminance distributions showing equivalent maximum luminance values as shown in FIGS. 1(c-1) and 2(c-1) may also be obtained. If fluorescent substance layers are disposed on the light-emitting surfaces of such semiconductor light-emitting layers, and the lights emitted in such luminance distributions as mentioned above pass through the fluorescent substance layers, the inclination of the luminance distribution is made gentler, and therefore a nearly flat luminance distribution can be obtained for the longitudinal direction B as shown in FIGS. 1(d-1) and 2(d-1).

Further, it is desirable that the semiconductor light-emitting layers 11 to 14 have such a structure that light emission amount of each light-emitting surface is larger in both end parts compared with a center part for the direction A perpendicular to the row direction B as shown in FIGS. 1(c-2) and 2(c-2). When the fluorescent substance layers are disposed on the light-emitting surfaces of such semiconductor light-emitting layers 11 to 14, and lights emitted in the aforementioned luminance distributions pass through the fluorescent substance layers, a flat luminance distribution can be obtained for the shorter side direction A as shown in FIGS. 1(d-2) and 2(d-2), because the light emission amount of the center part of the fluorescent substance layer is increased by scattering of lights in the fluorescent substance layers.

The structure for inclining the light emission amount at the light-emitting surface may be any kind of structure. For example, there can be employed such a structure that the luminance distribution is inclined by forming a plurality of convexes or concaves on the light-emitting surfaces of the semiconductor light-emitting layers 11 to 14 with different densities of the convexes or concaves. There can also be employed, for example, such a structure that the luminance distribution of the semiconductor light-emitting layers 11 to 14 is inclined by forming a configuration that the semiconductor light-emitting layers 11 to 14 have one or more semiconductor layers, and a plurality of via electrodes that penetrate the semiconductor layers and supply electric currents to the semiconductor layers with different densities of the via electrodes.

Hereafter, embodiments of the semiconductor light-emitting device of the present invention will be specifically explained.

Embodiment 1

In the semiconductor light-emitting device of the embodiment 1, a plurality of convexes or concaves are formed on the light-emitting surfaces of the semiconductor light-emitting layers with different densities of the convexes or concaves to incline the luminance distribution.

As shown in FIGS. 1(a) and 1(b), a plurality of the semiconductor light-emitting layers 11 to 14 disposed on the substrate 1 in a row each have a predetermined shape (rectangle in this example). The layer structure thereof may have any configuration so long as such a configuration that light of a desired wavelength can be emitted from the upper or lower surface is employed. For example, the semiconductor light-emitting layers 11 to 14 may have such a layer structure as shown in FIGS. 3(a) and 3(b), or such a layer structure using via electrodes 32 as shown in FIG. 4.

The semiconductor light-emitting layers 11 to 14 of the structure shown in FIGS. 3(a) and 3(b) comprise a p-electrode 21d, which is a reflector electrode, p-type semiconductor layer 21c, light-emitting layer (active layer) 21b, n-type semiconductor layer 21a, and n-electrode 21f, which are laminated on the upper surface of the substrate 1 in this order. On the back face of the substrate 1, an electrode 21g is disposed. The n-electrode 21f is disposed only on circumferential parts of the n-type semiconductor layer 21a so that it does not inhibit light emission from the upper surface (refer to FIG. 3(b)).

The semiconductor light-emitting layers 11 to 14 shown in FIG. 4 comprise an insulating layer 31b-2, p-wiring 31a, insulating layer 31b-1, n-wiring 31c, adhering electrode 31d, n-electrode 21f, insulating layer 31e, p-electrode 21d, p-type semiconductor layer 21c, light-emitting layer (active layer)

21b, and n-type semiconductor layer 21a, which are successively laminated on the upper surface of the substrate 1. The n-electrode 21f is disposed in the region of the n-wiring 31c, and formed in a convex shape, and penetrates the p-type semiconductor layer 21c and the light-emitting layer (active layer) 21b, and the tip end thereof reaches the n-type semiconductor layer 21a to constitute the via electrode 32. On the both sides of the n-wiring 31c and the adhering electrode 31d, there are provided gaps 31k for electrically separating regions 31c-p and 31d-p, which are formed simultaneously with the foregoing layers, and for connecting the p-electrode 21d and the p-wiring 31a, from the n-wiring 31c and the adhering electrode 31d. As described above, the semiconductor light-emitting device shown in FIG. 4 is a metal bonding element.

As shown in FIGS. 1(a)-1(e), terminals 15 and 16 are disposed on the substrate 1. The p-wiring 31a and the n-wiring 31c of the semiconductor light-emitting layers 11 to 14 shown in FIG. 4 are formed in a wiring pattern that connects the n-electrode 21f and the p-electrode 21d with the terminals 15 and 16 with a desired circuit. Although not shown in FIGS. 3(a) and 3(b), the p-wiring 31a and n-wiring 31c that connects the terminals 15 and 16 and the n-electrode 21f and the p-electrode 21d with a desired circuit are disposed between the semiconductor light-emitting layers 11 to 14 and the substrate 1 or the like shown in FIGS. 3(a) and 3(b).

The p-wiring 31a and the n-wiring 31c can be made in, for example, a cathode common wiring pattern comprising a common wiring 201 that commonly connects the cathodes (n-electrodes 21f) of the semiconductor light-emitting layers 11 to 14, and a wiring 202 that individually connects the anodes (p-electrodes 21d) of the semiconductor light-emitting layers 11 to 14, as shown in FIG. 5(a). The p-wiring 31a and the n-wiring 31c can also be made in a switching circuit pattern comprising a wiring 203 that connects the cathodes (n-electrodes 21f) and anodes (p-electrodes 21d) of the semiconductor light-emitting layers 11 to 14 in series, and in addition, a wiring 204 that enables electric current supply to each of the semiconductor light-emitting layer 11 to 14, as shown in FIG. 5(b). FIGS. 5(a) and 5(b) show wirings for a configuration that a plurality of the semiconductor light-emitting devices of the embodiment 1 are disposed in a row.

If an electric current is supplied between the p-electrode 21g and the n-electrode 21f via the terminals 15 and 16 in the semiconductor light-emitting layers 11 to 14 having the layer structure shown in FIGS. 3(a) and 3(b), light of a desired wavelength is emitted from the active layer 21b, reflected by the p-electrode 21d (high reflectance), and emitted from the upper surface of the n-type semiconductor layer 21a. When the semiconductor light-emitting layers 11 to 14 having the layer structure shown in FIG. 4 are used, if an electric current is supplied between the p-electrode 21g and the n-electrode 21f via the terminals 15 and 16, the electric current spreads from the via electrode 32 (n-electrode 21f) to the n-type semiconductor layer 21a, light-emitting layer (active layer) 21b, and p-type semiconductor layer 21c, light of a desired wavelength is emitted from the light-emitting layer (active layer) 21b, reflected by the p-electrode 21d (high reflectance), and emitted from the upper surface of the n-type semiconductor layer 21a. Therefore, both in the cases of the layer structure shown in FIGS. 3(a) and 3(b), and the layer structure shown in FIG. 4, the upper surface of the n-type semiconductor layer 21a serves as the light-emitting surface. For example, if an InGaN type semiconductor is used for the active layer 21b, blue light is emitted from the upper surface.

As shown in FIGS. 3(a) and 3(b), or FIG. 4, the minute convexes 22 or concaves are formed on the light-emitting surfaces (upper surfaces of the n-type semiconductor layers 21a) of the semiconductor light-emitting layers 11 to 14. The surfaces that constitute the minute convexes 22 or concaves incline with respect to the flat upper surface of the semiconductor layer 21a. Therefore, light emission efficiency of the convexes 22 or concaves increases. By designing size, density distribution etc. of the convexes 22 or concaves, light emission efficiency of the region in which the convexes 22 or concaves are disposed can be controlled. The luminance distribution of the light-emitting surface can be thereby inclined for the row direction B as shown in FIG. 1(c-1).

In FIGS. 3(a) and 3(b), a configuration that the convexes 22 in the shape of polyangular pyramid are formed at different densities depending on regions of the light-emitting surface is shown as an example. For example, as shown in FIGS. 1(a) and 1(b), in each of the light-emitting surfaces of the semiconductor light-emitting layers 11 to 14, there is defined a rectangular region 23a, called first region, on the center line of the light-emitting surface along the row direction B, of which one end corresponds to an end 23e on the side of the aforementioned other end 17b, and in which density of the convexes 22 is lowest in the light-emitting surface. There are also defined a second region 23b, in which the density of the convexes 22 is larger than that of the first region 23a, so as to surround the three sides of the first region 23a other than the side of the end 23e, and a third region 23c, in which the density of the convexes 22 is larger than that of the second region 23b, so as to surround the three side of the second region 23b other than the side of the end 23e. Also when the semiconductor light-emitting layers 11 to 14 of the layer structure shown in FIG. 4 are used, the density of the convexes 22 is similarly set for every region.

If such regions 23a, 23b, and 23c as mentioned above are provided, the density of the convexes 22 (or concaves) in the light-emitting surface becomes lower along the direction B of the row of the light-emitting surfaces from the region 23c on the side of the one end 17a to the region 23a on the side of the other end 17b in each of the semiconductor light-emitting layer 11 to 14, and thus the luminance distribution of each light-emitting surface for the row (long side) direction B can be inclined as shown in FIG. 1(c-1). For the short side direction A perpendicular to the row (long side) direction B, the density of the convexes 22 (or concaves) is larger at the both end parts than at the center part, and the luminance of the light-emitting surface in the both end parts can be made higher compared with the center part as shown in FIG. 1(c-2).

As a method for providing a plurality of the regions 23a, 23b, and 23c on the light-emitting surface of each of the semiconductor light-emitting layers 11 to 14 and forming the convexes 22 (or concaves) on them with different densities as described above, such a method as mentioned below can be used. First, the step of laminating the semiconductor layers 21d to 21a etc. on the substrate 1 is performed, and then the step of subjecting the light-emitting surface to wet etching or dry etching to form the convexes 22 (or concaves) on the upper surface of the semiconductor layer 21a is performed. In this step, by preparing a masking pattern for each of the regions 23a, 23b and 23c, and successively repeating a process of forming the convexes 22 (or concaves) at each density in each region, the plurality of the regions having the density distributions shown FIG. 1(a) become usable.

On the light-emitting surfaces of the semiconductor light-emitting layers 11 to 14, a fluorescent substance layer 18 is disposed as a wavelength conversion layer. As the fluorescent substance layer 18, a layer comprising a binder consisting of an organic or inorganic material and fluorescent substance particles dispersed in the binder, ceramics obtained by sintering fluorescent substance particles, and so forth can be used. Light emitted from the light-emitting surface enters into the fluorescent substance layer 18, and converted into fluorescence because a part of the light is absorbed by the fluorescent substance to excite the fluorescent substance. The reminder of the incident light passes through the fluorescent substance layer 18, mixed with the fluorescence, and emitted from the fluorescent substance layer 18. The wavelength of the light emitted from the semiconductor light-emitting layers 11 to 14 can be thereby converted to a desired wavelength. For example, if a semiconductor that emits blue light (for example, InGaN type) is used as the semiconductor light-emitting layers 11 to 14, and a fluorescent substance that is excited by blue light and emits yellow light (for example, YAG fluorescent substance) is used as the fluorescent substance of the fluorescent substance layer 18, white light as a mixture of the blue light and yellow light can be emitted from the fluorescent substance layer 18.

When the light emitted from the light-emitting surface of the semiconductor light-emitting layers 11 to 14 passes through the fluorescent substance layer 18, it is scattered by the fluorescent substance particles, and a part of it becomes ingredients that are guided in the inside of the fluorescent substance layer 18. Therefore, the luminance distribution of the light emitted from the fluorescent substance layer 18 is gentler than the luminance distribution of the light emitted from the semiconductor light-emitting layers 11 to 14. Accordingly, the luminance distribution of the fluorescent substance layer 18 becomes a gentler luminance distribution (FIGS. 1(d-1) and 1(d-2)) compared with the luminance distribution of the light emitted from the semiconductor light-emitting layers 11 to 14 (FIGS. 1(c-1) and 1(c-2)) for the long side direction B and the short side direction A. As a result, a substantially flat luminance distribution can be obtained for the long side direction B, although a gentle inclination is repeated in the luminance distributions of the semiconductor light-emitting layer 11 to 14. For the short side direction A, a flat luminance distribution can be obtained. Further, by setting the current amounts supplied to the semiconductor light-emitting layers 11 to 14 so that they successively become smaller from the end 17a to the end 17b as shown in FIG. 1(e) (for example, they are set so that the ratios of the electric currents are 100%, 75%, 50%, and 25%, respectively), the luminance distribution can be linearly inclined for the long side direction B.

Embodiment 2

The semiconductor light-emitting device of the embodiment 2 has a structure that the luminance distribution is inclined by changing density of via electrodes.

As shown in FIGS. 2(a) and 2(b), a plurality of the semiconductor light-emitting layers 11 to 14 disposed in a row on the substrate 1 have a predetermined shape (rectangle in this example). The plurality of the semiconductor light-emitting layers 11 to 14 each have one or more semiconductor layers disposed on the substrate, and a plurality of via electrodes 32 that supply electric current to the semiconductor layers.

The configuration of the layer structure of the semiconductor light-emitting layers 11 to 14 may be any configuration so long as light of a desired wavelength can be emitted from the upper surface or lower surface, and there are provided the via electrodes 32. For example, the layer structure shown in FIG. 4 can be used for the semiconductor light-emitting layers 11 to 14. In the embodiment 2, the convexes 22 or concaves on the surfaces of the semiconductor light-emitting layers 11 to 14 are uniformly formed over the whole surfaces.

According to the embodiment 2, in such a configuration as mentioned above, density of the plurality of the via electrodes 32 in the light-emitting surface is set so that, compared with the density of a region on the side of an end 23f closer to the one end 17a, the density of a region on the side of an end 23e closer to the other end 17b is lower for the direction B of the row of light-emitting surfaces in each of the semiconductor light-emitting layer 11 to 14 as shown in FIG. 2(a). Therefore, current density in a region nearer to the end 23f where the density of the via electrode 32 is larger becomes higher, and therefore light emission amount becomes larger, whereas current density in a region nearer to the end 23e where the density of the via electrode 32 is lower becomes lower, and therefore light emission amount becomes smaller. Accordingly, as shown in FIG. 2(c-1), a luminance distribution inclined for the row (long side) direction B can be obtained for every semiconductor light-emitting layer.

Further, by setting the density of the via electrodes 32 so that it becomes larger in the both end regions compared with a region at the center part for the direction A perpendicular to the row direction B, such a luminance distribution in which luminance is higher in regions of the both end parts compared with a region of the center part for the short side direction A as shown in FIG. 2(c-2) can be obtained.

As a method for forming the via electrodes 32 with varying density distribution on the light-emitting surfaces of the semiconductor light-emitting layers 11 to 14 having the layer structure shown in FIG. 4, such a method as mentioned below can be used. First, the step of laminating the n-type semiconductor layer 21a, light-emitting layer (active layer) 21b, p-type semiconductor layer 21c, and p-electrode 21d on a device substrate not shown in the drawing is performed, and then via holes are formed at the positions of the via electrodes 32 by wet etching or dry etching. In this process, the via holes are formed by using a masking pattern prepared beforehand so that the density of the via holes has such distributions as described above for the long side direction B and the short side direction A as shown in FIG. 2(a). For example, they are formed so that five, four, three, and two via holes 32a are each disposed in a row for the short side direction from the end 23f to the end 23e as shown in FIG. 2(a). In this process, for the short side direction, intervals of the via holes 32a are adjusted so that the density of the via holes 32a become larger at the both end parts compared with the center part. Then, after the insulating layer 31e is formed around the via holes, the n-electrode 21f consisting of an n-type metal is filled in the via holes to form the via electrodes 32. Further, in a separated process, the insulating layer 31b-2, p-wiring 31a, insulating layer 31b-1, and n-wiring 31c are formed on the substrate 1. On the substrate 1, the p-electrode 21d and the n-electrode 21f (via electrode 32) are adhered with the adhering electrode 31d and connected. The device substrate is then removed, or the device substrate is removed before the adhesion with the adhering electrode 31d. By such a process as described above, the semiconductor light-emitting layers 11 to 14 of the layer structure shown in FIG. 4 having the via electrodes 32 disposed in such a predetermined density distribution as shown in FIG. 2(a) can be produced.

On the light-emitting surfaces of the semiconductor light-emitting layers 11 to 14, a fluorescent substance layer (not shown in FIG. 2(b)) is disposed as a wavelength conversion layer. The same layers as those mentioned for the embodiment 1 can be used for the fluorescent substance layer 18. When the light emitted from the light-emitting surfaces of the semiconductor light-emitting layers 11 to 14 passes through the fluorescent substance layer, it is scattered by the fluorescent substance particles. Therefore, the luminance distribution of the light emitted from the fluorescent substance layer is gentler than the luminance distribution of the light emitted from the semiconductor light-emitting layers 11 to 14. Accordingly, the luminance distribution of the light emitted from the fluorescent substance layer becomes a gentler luminance distribution (FIGS. 2(d-1) and 2(d-2)) compared with the luminance distribution of the light emitted from the semiconductor light-emitting layers 11 to 14 (FIGS. 2(c-1) and 2(c-2)) for the long side direction B and the short side direction A. As a result, a substantially flat luminance distribution can be obtained for the long side direction B, although a gentle inclination is repeated in the luminance distributions of the semiconductor light-emitting layers 11 to 14. For the short side direction A, a flat luminance distribution can be obtained. Further, by setting the current amounts supplied to the semiconductor light-emitting layers 11 to 14 so that they successively becomes smaller from the end 17a to the end 17b as shown in FIG. 2(e) (for example, they are set so that the ratios of the electric currents are 100%, 75%, 50%, and 25%, respectively), the luminance distribution can be linearly inclined for the long side direction B.

Embodiment 3

The semiconductor light-emitting device of the embodiment 3 will be explained with reference to FIGS. 6(a)-6(e).

Although the fundamental configuration of the semiconductor light-emitting device of the embodiment 3 is the same as that of the device of the embodiment 1, it differs from that of the embodiment 1 in that, among the semiconductor light-emitting layers 11 to 14, a semiconductor light-emitting layer closer to the other end 17b of the row has a larger area as shown in FIGS. 6(a) and 6(b).

Further, the maximum density of the convexes 22 in the light-emitting surface is larger in the semiconductor light-emitting layer 11 on the side of the one end 17a for the row direction B compared with that of the semiconductor light-emitting layer 14 on the side of the other end 17b among the plurality of the semiconductor light-emitting layers. Specifically, when the relative densities of the convexes 22 of the third region 23c, second region 23b, and first region 23a of the light-emitting surface of the semiconductor light-emitting layer 11 are 6, 5, and 4, respectively, the relative densities of the convexes 22 of the third region 23c, second region 23b, and first region 23a of the semiconductor light-emitting layer 12 are adjusted to be 5, 4, and 3, respectively, the relative densities of the convexes 22 of the third region 23c, second region 23b, and first region 23a of the semiconductor light-emitting layer 13 are adjusted to be 4, 3, and 2, respectively, and the relative densities of the convexes 22 of the third region 23c, second region 23b, and first region 23a of the semiconductor light-emitting layer 14 are adjusted to be 3, 2, and 1, respectively.

By using such different densities as described above in the semiconductor light-emitting layers 11 to 14, difference of the luminance between adjacent layers among the semiconductor light-emitting layers 11 to 14 can be made smaller. In addition, it has been found that if the area of the semiconductor light-emitting layer is changed as in the embodiment 3 with the density distribution of convexes 22 of the embodiment 1, the luminance differences of the semiconductor light-emitting layers 11 to 14 become large, and unevenness of the luminance occurs in light distribution.

In the semiconductor light-emitting device of this embodiment, as shown in FIG. 6(c), the luminance distributions of the semiconductor light-emitting layers are characterized in that the luminance of the semiconductor light-emitting layer 11 having the smallest area of the semiconductor light-emitting layer is the highest, the luminance gradually becomes lower as the area becomes larger, and the luminance of the semiconductor light-emitting layer 14 having the largest light emission area is the smallest, but the luminance distribution is not inclined so significantly to lower the luminance even in the semiconductor light-emitting layer 14 having a large semiconductor light-emitting layer area. FIG. 6(d) shows the luminance distributions observed after wavelength conversion by the fluorescent substance layers 18.

By adjusting values of electric currents supplied to the semiconductor light-emitting layers 11 to 14, respectively, luminance distribution of emitted lights of the four semiconductor light-emitting layers 11 to 14 can be linearly inclined as shown in FIG. 6(e).

Embodiment 4

The semiconductor light-emitting device of the embodiment 4 will be explained with reference to FIGS. 7(a)-7(e).

The fundamental configuration of the semiconductor light-emitting device of the embodiment 4 is the same as that of the device of the embodiment 2. However, among the semiconductor light-emitting layers 11 to 14, a semiconductor light-emitting layer closer to the other end 17b has a larger area as shown in FIGS. 7(a) and 7(b).

Further, the maximum density of the via electrodes 32 in the light-emitting surface is larger in the semiconductor light-emitting layer 11 on the side of the one end 17a for the row direction B compared with the semiconductor light-emitting layer 14 on the side of the other end 17b among the plurality of the semiconductor light-emitting layers.

The semiconductor light-emitting device of the embodiment 4 functions in the same manner as that of the device of the embodiment 3, and such luminance distributions as shown in FIGS. 7(c) to 7(e) are obtained.

Embodiment 5

Figure 9:
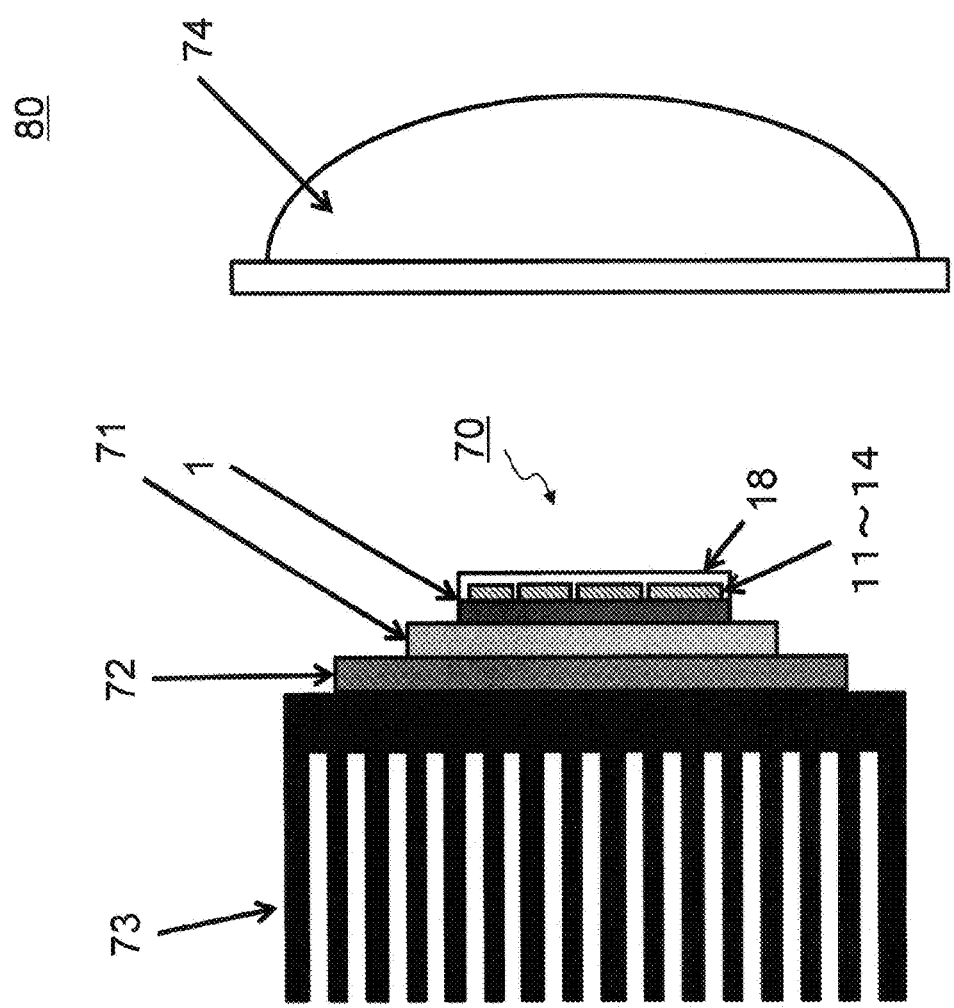
FIG. 9 is a drawing showing the configuration of the whole lighting apparatus of the embodiment 5.

As the embodiment 5, a lighting apparatus 80 using a sheet light source 70 comprising a plurality of the semiconductor light-emitting devices 10 of the embodiment 3 (8 devices in the apparatus shown in FIG. 8(a)) disposed in the direction A perpendicular to the row direction B as shown in FIGS. 8(a) and 9 will be explained. The lighting apparatus 80 comprises at least a lens 74 that projects light emitted by the sheet light source 70, besides the sheet light source 70. It may have a configuration comprising, in addition to those mentioned above, a submount substrate 71 that supports the sheet light source 70, metal substrate 72 that carries the submount substrate 71, and heat sink 73 connected to the metal substrate 72. The metal substrate receives the heat generated in the sheet light source 70 via the submount 71, and efficiently conducts it to the heat sink 73. The heat sink 73 radiates the received heat into the atmosphere. It is of course also possible to dispose a plurality of the semiconductor light-emitting devices 10 along not only the short side direction A, but also the row direction B to dispose them in the shape of a matrix.

The interval of the adjacent semiconductor light-emitting devices 10 for the short side direction A can be such a small interval as about several tens of micrometers.

The sheet light source shown in FIG. 8(a) can provide such a flat luminance distribution for the short side direction A of the semiconductor light-emitting device 10 as shown in FIG. 8(b). For the row (long side) direction B, the luminance distribution can be smoothly inclined as shown in FIG. 8(c) by adjusting currents supplied to the respective semiconductor light-emitting layers. Further, when the currents supplied to the semiconductor light-emitting layers are not adjusted, incline of luminance distribution of each of the semiconductor light-emitting layers 11 to 14 is repeated, but a substantially flat luminance distribution can be obtained as a whole, as in the case shown in FIG. 1(d-1) mentioned above.

Embodiment 6

Figure 10A:
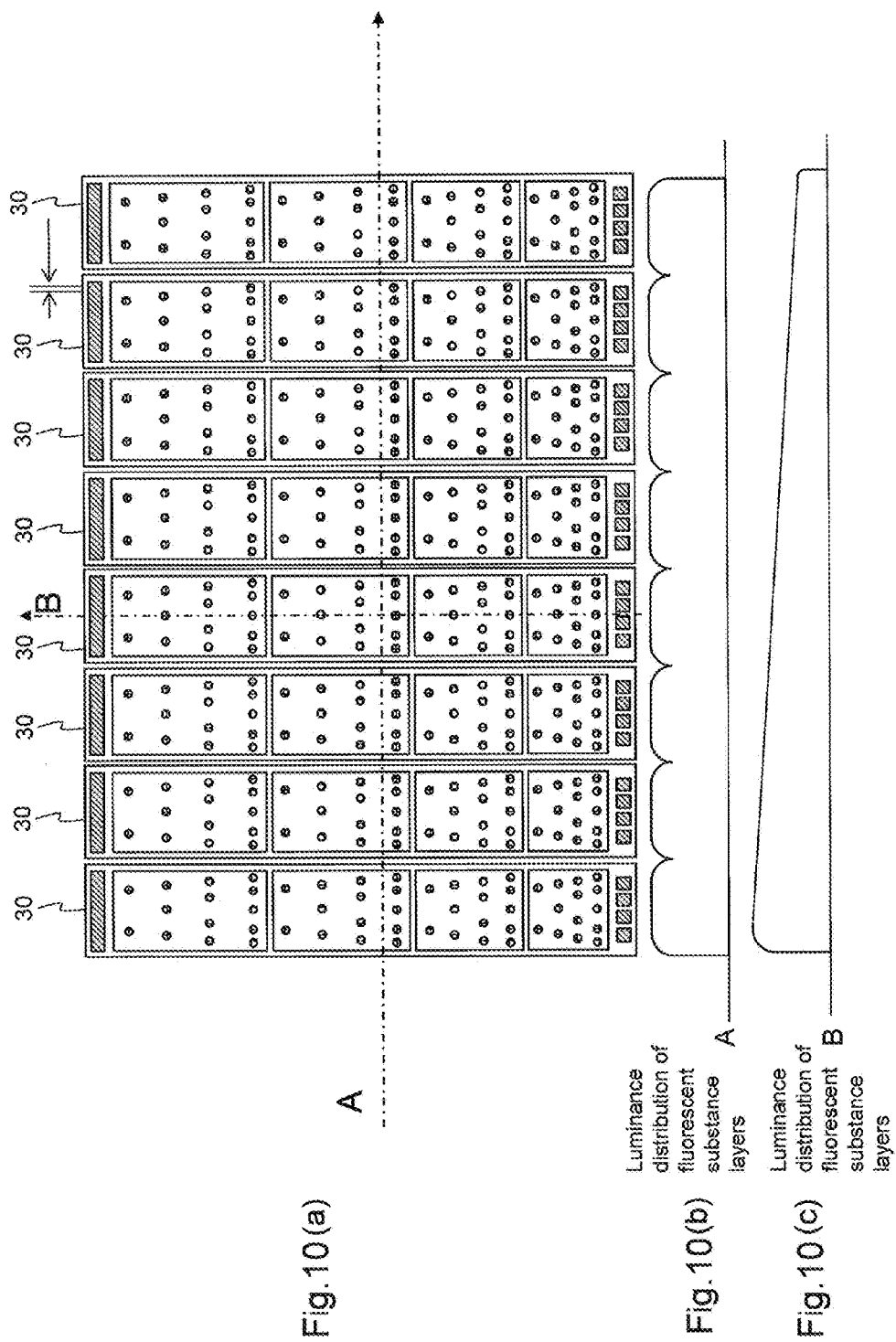
FIG. 10(a) is an explanatory drawing showing the configuration of the upper surface, and the density distribution of the via electrodes of the sheet light source of the embodiment 6.

As the embodiment 6, a sheet light source 70 comprising a plurality of the semiconductor light-emitting devices 30 of the embodiment 4 (8 devices in the case shown in FIG. 10(a)) disposed in the direction A perpendicular to the row direction B as shown in FIG. 10(a) will be explained.

Like the sheet light source of the embodiment 5 mentioned above, the sheet light source shown in FIG. 10(a) can provide such a flat luminance distribution for the short side direction A of the semiconductor light-emitting device 30 as shown in FIG. 10(b). For the row (long side) direction B, the luminance distribution can be smoothly inclined as shown in FIG. 10(c), or a substantially flat luminance distribution can also be obtained as a whole even with repetition of inclined luminance distribution of each of the semiconductor light-emitting layers 11 to 14 as in the case shown in FIG. 1(d-1).

Embodiment 7

The semiconductor light-emitting device of the embodiment 7 will be explained.

Figure 12:
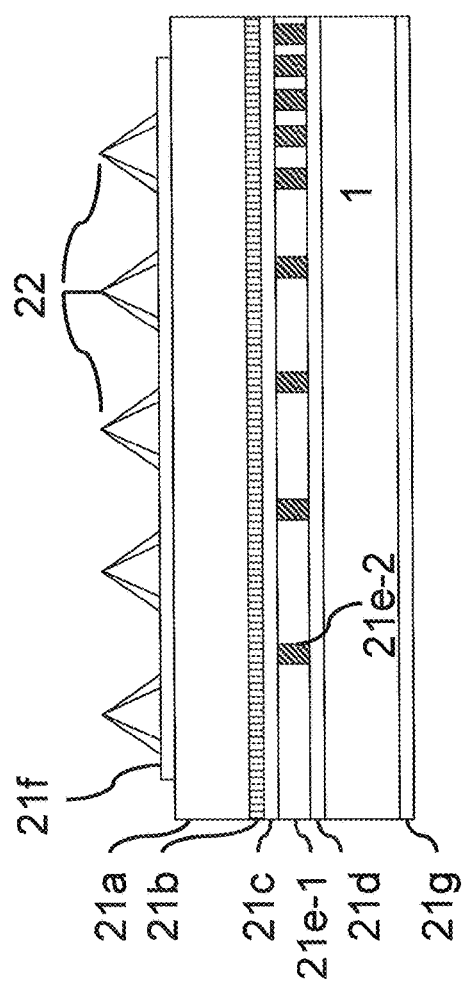
FIG. 12 is a cross-sectional view of an example of the semiconductor layer of the semiconductor light-emitting device of the embodiment 7.

As shown in FIGS. 11(a)-11(e), the semiconductor light-emitting device of the embodiment 7 has the same configuration as that of the embodiment 1, but as shown in FIG. 12, it comprises a contact electrode layer 21e-1 between a semiconductor layer (p-type semiconductor layer 21c in this example) and an electrode (p-electrode 21d in this example). The contact electrode layer 21e-1 has a contact resistance distribution for the plane direction. The luminance distribution is inclined by this contact resistance distribution. Such a contact resistance distribution of the contact electrode layer 21e-1 can be formed by, for example, forming a plurality of holes or high contact resistance parts (non-contact electrode parts 21e-2) in the contact electrode layer 21e-1 with changing density of them. In the following explanation, to the same components as those of the embodiment 1, the same numerals and codes are attached, and explanations thereof are omitted.

The layer structure of the semiconductor light-emitting layers 11 to 14 may have any configuration so long as such a configuration that light of a desired wavelength can be emitted from the upper or lower surface is employed. For example, the semiconductor light-emitting layers 11 to 14 may have the same configuration as that of the layer structure of the embodiment 1 shown in FIG. 3(a), but in which the contact electrode layer 21e-1 is disposed between the p-electrode 21d and the p-type semiconductor layer 21c, and non-contact parts 21e-2 are provided in the contact electrode layer 21e-1 as shown in FIG. 12. The semiconductor light-emitting layers 11 to 14 may also have the structure shown in FIG. 4 comprising the via electrodes 32. Also in this case, a configuration that the contact electrode layer 21e-1 is disposed between the p-electrode 21d and the p-type semiconductor layer 21c, and the non-contact parts 21e-2 are provided in the contact electrode layer can be employed. The other parts of the layer structure and the wiring are the same as those shown in FIG. 3(a). In this embodiment, the convexes 22 provided on the surfaces of the semiconductor light-emitting layers 11 to 14 are uniformly formed over the whole surfaces.

The contact electrode layer 21e-1 is formed with a material showing a low contact resistance to both the p-type semiconductor layer 21c and the p-electrode 21d such as metal or semiconductor showing high electric conductivity (p-type semiconductor in the example explained here). The non-contact electrode part 21e-2 is a region that shows high contact resistance to at least one of the p-type semiconductor layers 21c and the p-electrode 21d, and for example, a perforated hole provided in the contact electrode layer 21e-1 by etching or the like, region of a high contact resistance insulating material (for example, $SiO_2$, SiN, etc.) provided in the contact electrode layer 21e-1, or on or under the contact electrode layer 21e-1, or when the contact electrode layer 21e-1 is constituted with a semiconductor layer or metal, a region formed by partially making such a contact electrode layer highly resistant can be used as the non-contact electrode part 21e-2. As the method for making a semiconductor layer highly resistant, for example, plasma irradiation, ion implantation, and so forth can be used. Further, two or more of a plurality of kinds of non-contact electrode parts 21e-2 (perforated hole, high contact resistance material, and semiconductor region made highly resistant) can also be provided in combination in one layer of the contact electrode layer 21e-1.

Since the non-contact electrode part 21e-2 shows a higher contact resistance compared with the contact electrode part 21e-1 surrounding it, an electric current supplied between the p-electrode 21d and the n-electrode 21f mostly spreads and flows in the contact electrode layer 21e-1, and it does not flow in the non-contact electrode part 21e-2. Therefore, the electric current is not supplied to a region of the light-emitting layer (active layer) 21b right above the non-contact electrode part 21e-2, and such a region becomes a substantially non-light-emitting region. Therefore, when area of the non-contact electrode part 21e-2, or area of a plurality of the non-contact electrode parts 21e-2 is constant, effective light-emitting surface can be controlled by designing the density thereof, or the like. The luminance distribution can be thereby inclined along the row direction B of the light-emitting surface, as shown in FIG. 11(c-1).

Specifically, density of the non-contact electrode parts 21e-2 in the light-emitting surface, or total area of the non-contact electrode parts 21e-2 per unit area of the light-emitting surface is changed depending on position in the light-emitting surface to incline the luminance distribution for the row direction B. For example, as shown in FIGS. 11(a) and 11(b), there is defined a rectangular region 43a, called first region, on the center line of the light-emitting surface along the row direction B in each of the light-emitting surfaces of the semiconductor light-emitting layers 11 to 14, of which one end corresponds to an end 43e on the side of the aforementioned other end 17b, and in which density of the non-contact electrode parts 21e-2 is highest in the light-emitting surface. A second region 43b, in which the density of the non-contact electrode parts 21e-2 is lower than that of the first region 43a, is defined so as to surround the three side of the first region 43a other than the side of the end 43e, and a third region 43c, in which the density of the non-contact electrode parts 21e-2 is lower than that of the second region 43b, is defined so as to surround the three side of the second region 43b other than the side of the end 43e.

If such regions 43a, 43b, and 43c as mentioned above are provided, the density of the non-contact electrode parts 21e-2 (density of non-light-emitting regions) in the light-emitting surface becomes higher along the direction B of the row of the light-emitting surfaces from the region 43c on the side of the one end 17a to the region 43a on the side of the other end 17b in each of the semiconductor light-emitting layer 11 to 14, and thus the luminance distribution of the light-emitting surfaces can be inclined for the row (long side) direction B as shown in FIG. 11(c-1). For the short side direction A perpendicular to the row (long side) direction B, the density of the non-contact parts 21e-2 is lower at the both end parts than at the center part, and the average luminance of the light-emitting surface can be made higher in the both end parts compared with the center part as shown in FIG. 11(c-2).

As a method for providing a plurality of the regions 43a, 43b, and 43c in the light-emitting surface of each of the semiconductor light-emitting layers 11 to 14 and forming the non-contact electrode parts 21e-2 in them with changing the density as described above, such a method as mentioned below can be used. First, the step of laminating the semiconductor layers 21d to 21a on the substrate 1 is performed. When perforated holes are formed as the non-contact electrode parts 21e-2, the step of subjecting a part of the contact electrode layer 21e-1 to wet etching or dry etching is performed to form minute openings therein. The non-contact electrode parts 21e-2 can be thereby formed. In the case of etching, by preparing masking patterns of different opening densities for the regions 43a, 43b and 43c, respectively, and performing the etching step, the non-contact electrode parts 21e-2 can be formed in the density distributions shown FIG. 11(a). Further, the openings (non-contact electrode parts 21e-2) can also be formed by disposing a mask pattern on the p-electrode 21d before laminating the contact electrode layer 21e-1, and removing the mask pattern portion by lifting off after film formation of the contact electrode layer 21e-1. Then, the layers 21c to 21a are laminated. In the openings of the contact electrode layer 21e-1, the p-type semiconductor layer 21c and the p-electrode 21d do not form ohmic contact, they show high contact resistance, and serve as the non-contact electrode parts 21e-2.

When the non-contact electrode parts 21e-2 are formed with an insulating material, before or after the formation of the contact electrode layer 21e-1, an insulating layer is formed on parts in which the non-contact electrode parts 21e-2 should be formed. The insulating layer can be formed with a known insulating material such as $SiO_2$ and SiN. Then, the insulating layer is processed into a desired pattern by a known pattern formation method such as etching and lifting off. Then, the layers 21c to 21a are laminated. In the non-contact electrode parts 21e-2, supply of electric current from the p-electrode 21d to the p-type semiconductor layer 21c is inhibited by the insulating layer.

When the non-contact electrode parts are formed by a method for increasing resistance, the contact electrode layer 21e-1 is formed with a p-type semiconductor layer or metal layer, and a mask pattern having openings in regions corresponding to the non-contact electrode parts 21e-2 is disposed. Then, plasma treatment (for example, reverse sputtering etc.) or ion implantation with reversed polarity is performed for only the openings. The non-contact electrode parts 21e-2 can be thereby formed. The non-contact electrode parts 21e-2 can also be formed by directly performing plasma treatment (for example, reverse sputtering etc.) or ion implantation with reversed polarity for the p-type semiconductor layer 21c or p-electrode 21d. In this case, the non-contact electrode parts 21e-2 can be formed without forming the contact electrode layer 21e-1. The non-contact regions (non-light-emitting regions) can also be produced by partially removing the p-type semiconductor layer 21c and light-emitting layer 21b by etching, and electrically protecting the exposed etching sections with an insulating layer.

In this embodiment, the luminance distribution of light emitted from the light-emitting surfaces of the semiconductor light-emitting layers 11 to 14 is made gentle by scattering of the light by fluorescent substance particles at the time of passing through the fluorescent substance layers 18. Therefore, the luminance distributions of the semiconductor light-emitting layers for the long side direction B and the short side direction A are as shown in FIGS. 11(c-1) and 11(c-2), whereas the luminance distributions of the fluorescent substance layers 18 for those directions become gentle as shown in FIGS. 11(d-1) and 11(d-2). A substantially flat luminance distribution can be thereby obtained for the long side direction B, although the gentle inclination is repeated for the semiconductor light-emitting layer 11 to 14. For the short side direction A, a flat luminance distribution can be obtained. Further, by setting the current amounts supplied to the semiconductor light-emitting layers 11 to 14 so that they successively becomes smaller from the end 17a to the end 17b as shown in FIG. 11(e) (for example, they are set so that the ratios of the electric currents are 100%, 75%, 50%, and 25%, respectively), the luminance distribution can be linearly inclined for the long side direction B.

Embodiment 8

The semiconductor light-emitting device of the embodiment 8 will be explained with reference to FIGS. 13(a)-13(e).

Figure 13:
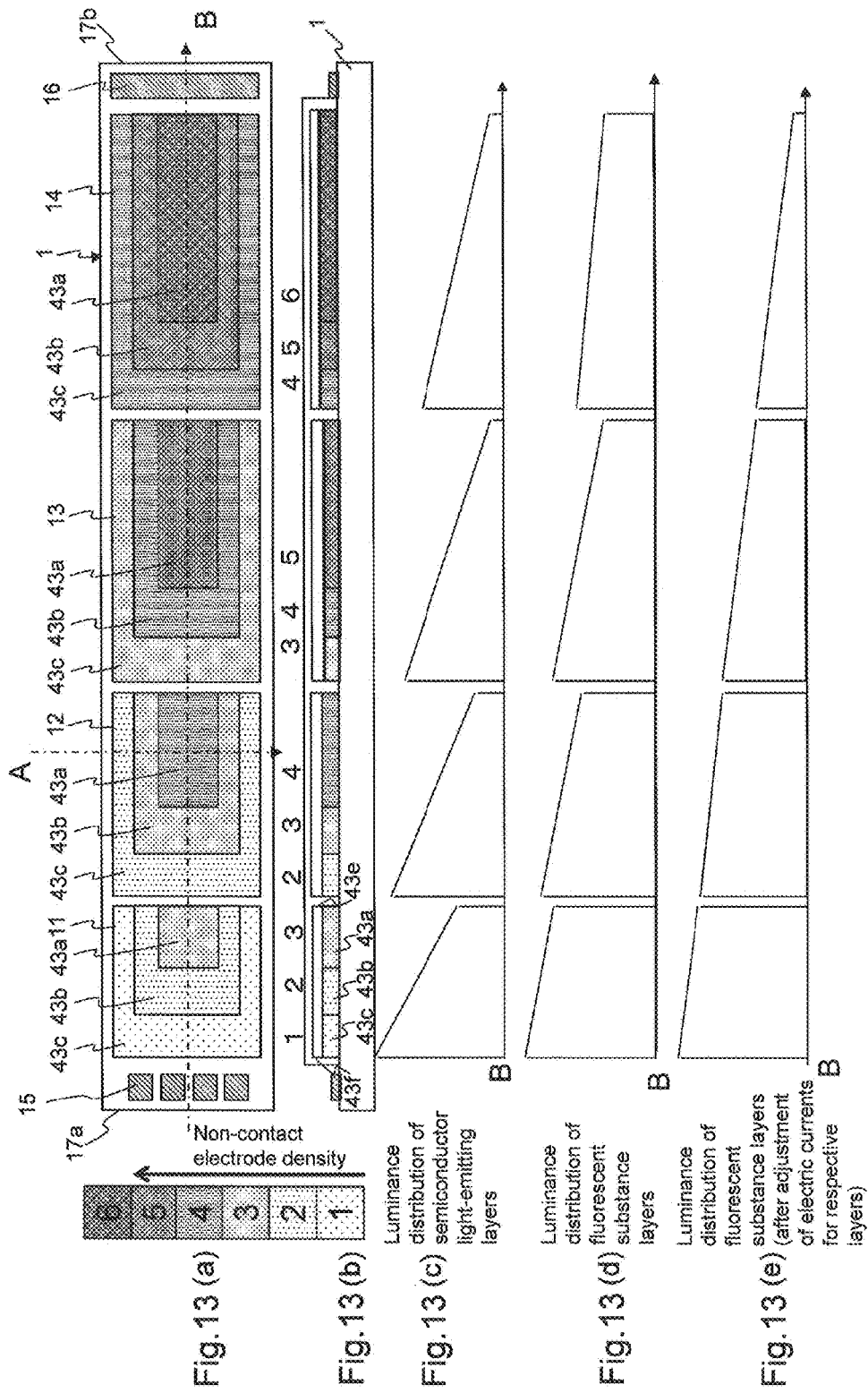
FIG. 13(a) is an explanatory drawing showing the configuration of the upper surface, and the density distribution of the non-contact electrodes of the semiconductor light-emitting device of the embodiment 8.
FIG. 13(b) is an explanatory drawing showing the configuration of the cross section, and the density distribution of the non-contact electrodes of the semiconductor light-emitting device shown in FIG. 13(a)
FIG. 13(c) shows the luminance distribution of the semiconductor light-emitting layers of the semiconductor light-emitting device shown in FIG. 13(a) for the direction B.
FIG. 13(d) shows the luminance distribution of emitted lights of the fluorescent substance layers of the semiconductor light-emitting device shown in FIG. 13(a) for the direction B.
FIG. 13(e) shows the luminance distribution of emitted lights of the fluorescent substance layers of the semiconductor light-emitting device for the direction B.

Although the fundamental configuration of the semiconductor light-emitting device of the embodiment 8 is the same as that of the device of the embodiment 7, it differs from that of the embodiment 7 in that a semiconductor light-emitting layer nearer to the other end 17b of the row among the semiconductor light-emitting layers 11 to 14 has a larger area as shown in FIGS. 13(a) and 13(b). The maximum densities (or total areas per unit area) of the non-contact electrode parts 21e-2 in the regions 43a to 43c of the light-emitting surfaces are lower in the semiconductor light-emitting layer 11 on the side of the one end 17a for the row direction B compared with the semiconductor light-emitting layer 14 on the side of the other end 17b among the plurality of the semiconductor light-emitting layers 11 to 14. Specifically, when the relative densities of the non-contact electrode parts 21e-2 of the third region 43c, second region 43b, and first region 43a of the light-emitting surface of semiconductor light-emitting layer 11 are 1, 2, and 3, respectively, the relative densities of the non-contact electrode parts 21e-2 of the third region 43c, second region 43b, and first region 43a of the semiconductor light-emitting layer 12 are adjusted to be 2, 3, and 4, respectively, the relative densities of the non-contact electrode parts 21e-2 of the third region 43c, second region 43b, and first region 43a of the semiconductor light-emitting layer 13 are adjusted to be 3, 4, and 5, respectively, and the relative densities of the non-contact electrode parts 21e-2 of the third region 43c, second region 43b, and first region 43a of the semiconductor light-emitting layer 14 are adjusted to be 4, 5, and 6, respectively.

By using different densities of the non-contact electrode parts 21e-2 in the semiconductor light-emitting layers 11 to 14 as described above, difference of the luminance between adjacent ones among the semiconductor light-emitting layers 11 to 14 can be made smaller.

In the semiconductor light-emitting device of this embodiment, the luminance distribution of the semiconductor light-emitting layers is characterized in that, as shown in FIG. 13(c), the luminance of the semiconductor light-emitting layer 11 having the smallest area of the semiconductor light-emitting layer is highest, the luminance gradually becomes lower as the area becomes smaller, and the luminance of the semiconductor light-emitting layer 14 having the largest light emission area is the smallest, but the luminance distribution is not inclined so significantly to lower the luminance even in the semiconductor light-emitting layer 14 having the semiconductor light-emitting layer of a large area. FIG. 13(c) shows the luminance distributions of the semiconductor light-emitting layers, and FIG. 13(d) shows the luminance distributions observed after wavelength conversion by the fluorescent substance layers 18. By adjusting electric current values supplied to the semiconductor light-emitting layers 11 to 14, respectively, luminance distribution of emitted lights of the four semiconductor light-emitting layers 11 to 14 can be linearly inclined as shown in FIG. 13(e).

Embodiment 9

Figure 14:
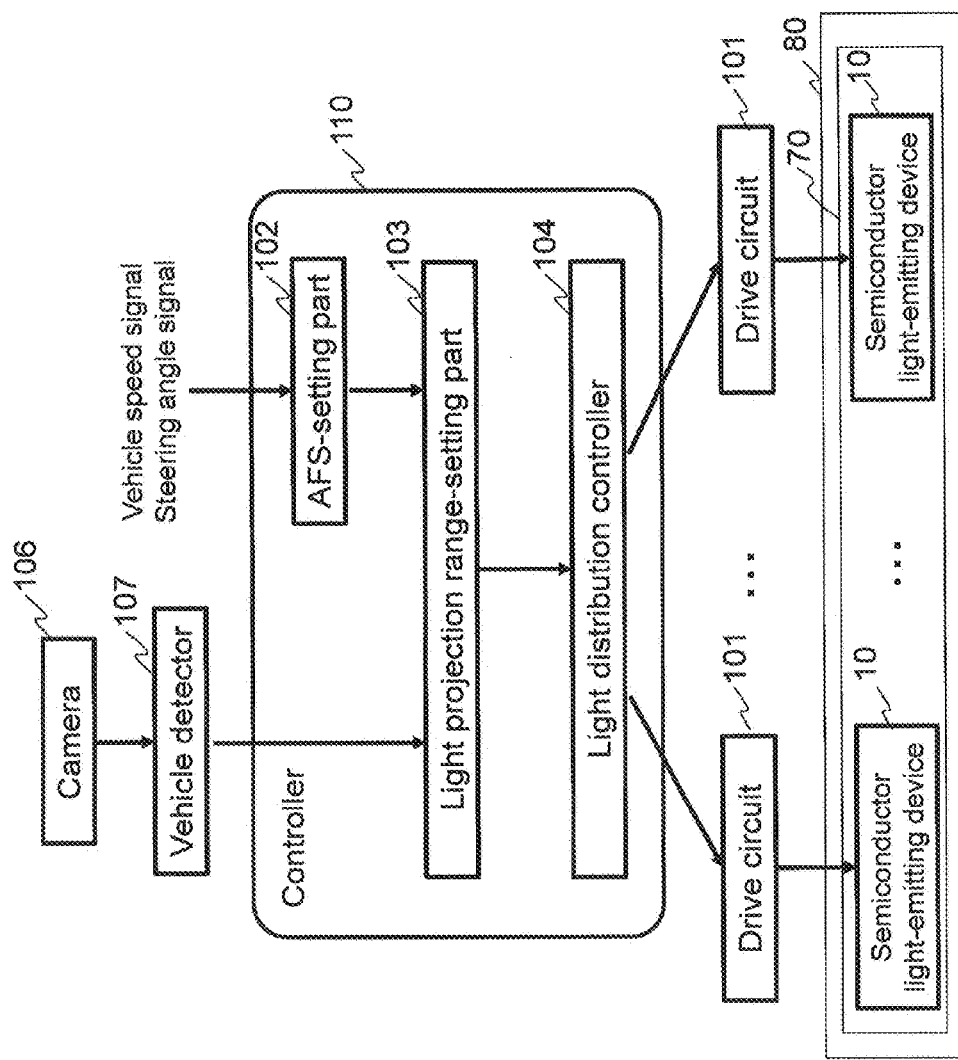
FIG. 14 is a block diagram showing the configuration of the lighting unit for vehicles of the embodiment 9.

As the embodiment 9, a lighting unit for vehicles using the lighting apparatus 80 of the embodiment 5 will be explained with reference to FIG. 14. The lighting unit for vehicles shown in FIG. 14 comprises, besides the lighting apparatus 80, a drive circuit 101 that drives the respective semiconductor light-emitting devices 10 of the lighting apparatus 80 for lighting, and controller 110. The vehicle carries a camera 106, and vehicle detector 107 for processing images captured by the camera 106 to detect vehicles, pedestrians, and obstacles. The controller 110 comprises an AFS (Adaptive Front-lighting System)-setting part 102, light projection range-setting part 103, and light distribution controller 104. The AFS-setting part 102 receives vehicle speed signal and steering angle signal from the vehicle, and sets a range of light projection as a predetermined range for the moving direction of the vehicle.

The light projection range-setting part 103 sets illuminance distribution for the light projection range set by the AFS-setting part 102 so that, when any vehicle, pedestrian, or obstacle detected by the vehicle detector 107 is not included in the light projection range, illuminance is highest in the center region for the moving direction, and gradually becomes lower towards the circumference as shown in FIG. 15(a). Further, when a vehicle, pedestrian, or obstacle detected by the vehicle detector 107 is included in the light projection range set by the AFS-setting part 102, light projection range-setting part 103 sets the illuminance distribution so that illuminance is reduced in regions for the directions of the oncoming vehicle and pedestrian so that the driver or pedestrian is not dazzled, and illuminance becomes highest in regions around the vehicle or pedestrian, and gradually reduces towards the outside as shown in FIG. 15(b). When an obstacle detected by the vehicle detector 107 is included in the light projection range set by the AFS-setting part 102, the light projection range-setting part 103 sets the illuminance distribution so that illuminance becomes highest in the region for the direction of the obstacle, and gradually reduces towards the circumference parts.

The light distribution controller 104 sets the luminance distribution of the sheet light source 70 as shown in FIGS. 16(a) to 16(c) for projecting light with the illuminance distribution set by the light projection range-setting part 103. Specifically, when any vehicle, pedestrian, or obstacle detected by the vehicle detector 107 is not included in the light projection range, the light distribution controller 104 sets the luminance distribution so that the luminance is the highest in such a center region for the moving direction as shown in FIG. 16(a), and gradually reduces towards the circumference part. When an obstacle is included in the light projection range, the light distribution controller 104 sets the luminance distribution so that the luminance is the highest in a region corresponding to the direction of the obstacle, and gradually reduces towards the circumference parts as shown in FIG. 16(b). When an oncoming vehicle or pedestrian is included in the light projection range, the light distribution controller 104 sets the luminance distribution so that luminance of the region corresponding to the direction of the oncoming vehicle or pedestrian becomes zero (light is put out), and the luminance becomes highest in the circumference parts of the region, and gradually reduces towards the outside as shown in FIG. 16(c).

The light distribution controller 104 sets values of electric current for the drive circuit 101 for realizing the set luminance distribution, and the drive circuit 101 supplies electric currents to the semiconductor light-emitting devices 10 of the sheet light source 70 at the set electric current values. As a result, the sheet light source 70 emits light in such luminance distributions as shown in FIGS. 16(a) to 16(c), and the emitted light is projected with the lens 74 in the projection range.

In this embodiment, the sheet light source 70 uses the semiconductor light-emitting devices 10, and therefore a linearly inclined luminance distribution can be formed for the longitudinal direction B. For the short side direction A, a flat luminance distribution can be obtained, and therefore the luminance distribution can be changed stepwise with the width of the short side. Accordingly, the luminance distribution can be smoothly inclined to reduce the luminance towards the outside, therefore light can be distributed with a natural illuminance distribution, and driver's visibility can be improved.

Comparative Example

Figure 17:
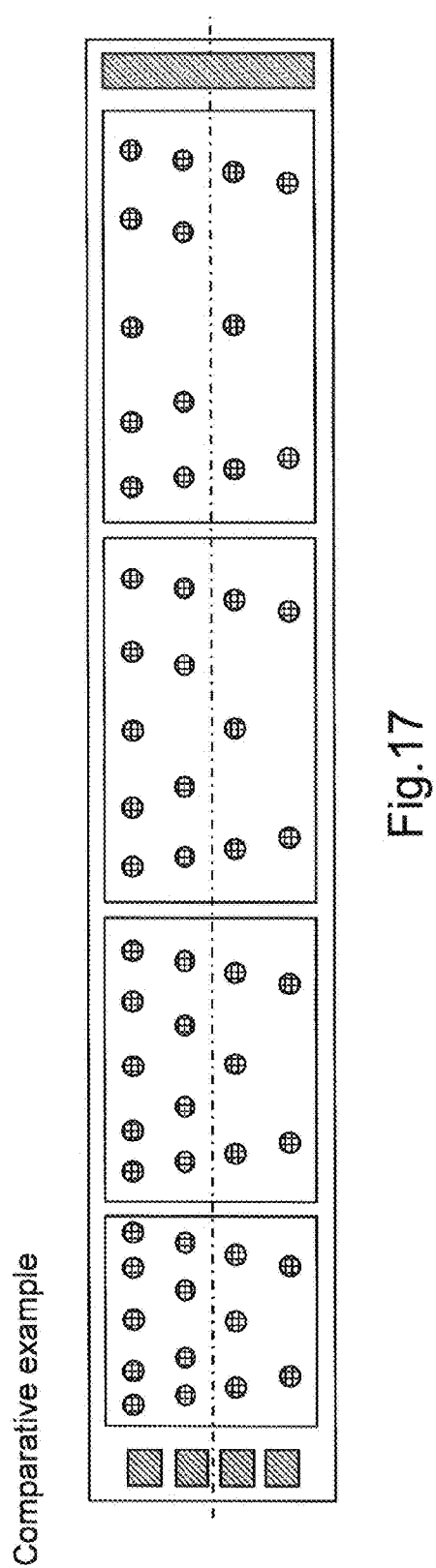
FIG. 17 is an explanatory drawing showing disposition of the via electrodes of the semiconductor light-emitting device of the comparative example.

As a comparative example, the via electrodes 32 of the semiconductor light-emitting device of the embodiment 4 were disposed with such a different density distribution of the via electrodes 32 that the luminance distribution changed only for the short side direction A as shown in FIG. 17. A plurality of the semiconductor light-emitting devices of this comparative example were disposed for the short side direction A to constitute such a sheet light source as shown in FIG. 18(a).

In the sheet light source of the comparative example, the inclined luminance distribution is repeated for every semiconductor light-emitting device for the short side direction A as shown in FIG. 18(b), and the luminance distribution changes stepwise for the long side (row) direction B as shown in FIG. 18(c). Therefore, in this comparative example, any linear inclination of the luminance distribution cannot be obtained for both the short side direction A and the long side direction. Accordingly, even if a lighting unit for vehicles is constituted by using the sheet light source of the comparative example, such a smooth luminance distribution as that of the embodiment 9 cannot be obtained, and such an effect of improving visibility of driver as that of the embodiment 9 cannot be obtained.

The semiconductor light-emitting devices of the embodiments of the present invention described above can be preferably used for a light distribution-variable headlight (Adaptive Driving Beam, ADB), special outdoor lighting unit, and so forth.

DESCRIPTION OF NUMERICAL NOTATIONS

1 . . . Substrate, 10 . . . semiconductor light-emitting device, 11 to 14 . . . semiconductor light-emitting layer, 15 and 16 . . . terminal, 17a and 17b . . . end, 18 . . . fluorescent substance layer, 21a . . . n-type semiconductor layer, 21b . . . light-emitting layer (active layer), 21c . . . p-type semiconductor layer, 21d . . . p-electrodes, 21f . . . n-electrode, 22 . . . convex, 23a to 23c . . . region, 31a . . . p-wiring, 31b-1 and 31b-2 . . . insulating layer, 31c . . . n-wiring, 31d . . . adhering electrode, 31e . . . insulating layer, 32 . . . via electrode, 43a to 43c . . . region, 70 . . . sheet light source, 80 . . . lighting apparatus, 202 to 204 . . . wiring

The invention claimed is:

1. A semiconductor light-emitting device comprising a substrate and a plurality of semiconductor light-emitting layers of a predetermined shape disposed in a row on the substrate, wherein:
the semiconductor light-emitting layers have such a structure that a distribution of a light emission amount of a light-emitting surface of each semiconductor light-emitting layer declines from a side of one predetermined end toward a side of the other end in a direction of the row,
the plurality of the semiconductor light-emitting layers each have one or more laminated semiconductor layers and a plurality of via electrodes that penetrate at least one of the one or more semiconductor layers and supply an electric current to the semiconductor layers, the light-emitting surfaces of the plurality of the semiconductor light-emitting layers being upper surfaces thereof or surfaces thereof on a side of the substrate,
a density of the plurality of the via electrodes in each of the semiconductor light-emitting layers is, compared with a region on the side of the one predetermined end, lower in a region on the side of the other end in the direction of the row of the light-emitting surfaces, and
wherein the maximum density of the via electrodes in a semiconductor light-emitting layer on the side of the one predetermined end in the direction of the row is larger than the maximum density of the via electrodes in a semiconductor light-emitting layer on the side of the other end among the plurality of the semiconductor light-emitting layers.

2. The semiconductor light-emitting device according to claim 1, wherein the semiconductor light-emitting layers have such a structure that the light emission amount of the light-emitting surface of each semiconductor light-emitting layer is larger in two end parts than in a center part in a direction perpendicular to the row direction.

3. The semiconductor light-emitting device according to claim 1, wherein a fluorescent substance layer is disposed on each of the light-emitting surfaces of the semiconductor light-emitting layers.

4. The semiconductor light-emitting device according to claim 1, wherein the density of the via electrodes in each of the semiconductor light-emitting layers is larger in two end regions compared with a center region in a direction perpendicular to the row direction.

5. The semiconductor light-emitting device according to claim 1, wherein an area of a semiconductor light-emitting layer nearer to the other end of the row is larger among areas of the plurality of the semiconductor light-emitting layers.

6. The semiconductor light-emitting device according to claim 1, further comprising a wiring that can supply an electric current to the plurality of semiconductor light-emitting layers in series, or individually to each of the semiconductor light-emitting layers.

7. A lighting apparatus having a sheet light source comprising a plurality of the semiconductor light-emitting devices according to claim 1 disposed at least in a direction perpendicular to the row direction, and a lens for projecting light emitted by the sheet light source.

8. A lighting unit for vehicles having the lighting apparatus according to claim 7, a drive circuit that drives the respective semiconductor light-emitting devices of the lighting apparatus for lighting, a light projection range-setting part that processes an image captured by a camera and sets a light projection range and light intensity distribution thereof, and a controller, wherein:
the controller controls the drive circuit so that only the semiconductor light-emitting devices corresponding to the range set by the light projection range-setting part emit light in light emission amounts corresponding to the light intensity distribution.

\* \* \* \* \*